United States Patent
den Besten

(10) Patent No.: US 9,379,694 B2
(45) Date of Patent: Jun. 28, 2016

(54) CONTROL-VOLTAGE OF PASS-GATE FOLLOWS SIGNAL

(75) Inventor: Gerrit Willem den Besten, Eindhoven (NL)

(73) Assignee: NXP B.V., Eindhoven (NL)

( * ) Notice: Subject to any disclaimer, the term of this patent is extended or adjusted under 35 U.S.C. 154(b) by 808 days.

(21) Appl. No.: 13/315,849

(22) Filed: Dec. 9, 2011

(65) Prior Publication Data

US 2012/0146705 A1 Jun. 14, 2012

(30) Foreign Application Priority Data

Dec. 13, 2010 (EP) .................................... 10194753

(51) Int. Cl.
*H03K 17/06* (2006.01)
*H03K 17/00* (2006.01)
*H03K 17/14* (2006.01)

(52) U.S. Cl.
CPC ............ *H03K 17/063* (2013.01); *H03K 17/005* (2013.01); *H03K 17/007* (2013.01); *H03K 17/145* (2013.01)

(58) Field of Classification Search
CPC . H03K 17/063; H03K 17/005; H03K 17/007; H03K 17/145
USPC ......... 327/427, 378, 379, 389, 390, 407, 408, 327/415, 416, 434
See application file for complete search history.

(56) References Cited

U.S. PATENT DOCUMENTS

| | | | |
|---|---|---|---|
| 4,813,041 A | 3/1989 | Reyneri | |
| 6,320,408 B1 * | 11/2001 | Kwong | 326/31 |
| 6,825,699 B2 * | 11/2004 | Marshall et al. | 327/108 |
| 7,427,887 B2 * | 9/2008 | O'Donnell et al. | 327/434 |
| 7,746,114 B2 * | 6/2010 | Nagase | 326/82 |
| 2004/0196089 A1 | 10/2004 | O'Donnell et al. | |
| 2004/0227565 A1 | 11/2004 | Chen et al. | |
| 2005/0077946 A1 | 4/2005 | Oppelt | |
| 2006/0022741 A1 | 2/2006 | Hopkins | |
| 2008/0074166 A1 * | 3/2008 | Merandat et al. | 327/407 |
| 2009/0108911 A1 | 4/2009 | Nakahara et al. | |

FOREIGN PATENT DOCUMENTS

| | | |
|---|---|---|
| JP | 10-084267 A | 3/1998 |
| JP | 10084267 A | 3/1998 |

OTHER PUBLICATIONS

Extended European Search Report for European Patent Appln. No. 10194753.9 (Nov. 3, 2011).

* cited by examiner

*Primary Examiner* — Jung Kim

(57) ABSTRACT

A pass-gate has a passageway between an input node and an output node. The pass-gate selectively opens or closes the passageway for a signal at the input node under control of a voltage. The pass-gate has a field-effect transistor with a gate electrode and a current channel. The current channel is arranged between the input node and the output node. The gate electrode receives the voltage. The pass-gate is configured so as to have the voltage at the control electrode substantially follow the signal at the input node when the passageway is open to the signal.

9 Claims, 12 Drawing Sheets

1000

CONTROL-VOLTAGE OF PASS-GATE FOLLOWS SIGNAL

CROSS-REFERENCE TO RELATED APPLICATIONS

This application claims the priority under 35 U.S.C. §119 of European patent application no. 10194753.9, filed on Dec. 13, 2010, the contents of which are incorporated by reference herein.

FIELD OF THE INVENTION

The invention relates to a first electronic circuit comprising a first pass-gate with a first voltage-controlled switch for controllably passing a single-ended signal. The invention also relates to a second electronic circuit comprising a first pass-gate with a first voltage-controlled switch and a second pass-gate with a second voltage-controlled switch for controllably passing a differential signal. The invention further relates to a third electronic circuit with an M×1 multiplexer for multiplexing a number of M single-ended input signals, to a fourth electronic circuit with an 1×M demultiplexer for demultiplexing a single single-ended input signal into a number of M single-ended output signals, to a fifth electronic circuit comprising an M×1 multiplexer for multiplexing a number of M differential input signals to a single differential output signal, to a sixth electronic circuit with a 1×M demultiplexer for demultiplexing a single differential input signal to a number of M differential output signals, to a seventh electronic circuit with an M×N multiplexer for multiplexing a number of M single-ended input signals, and to an eighth electronic circuit with an M×N multiplexer for multiplexing a number of M differential input signals.

BACKGROUND ART

High performance galvanic switches enable multiplexing of electric signals without buffering. Galvanic multiplexers are inherently bidirectional and conceptually simple. These properties create many opportunities for extending the number of ports by increasing the number of switches so long as the switch characteristics do not significantly affect the integrity of the signals.

A simple example of a configuration of a multiplexer is a circuit that selectively connects an input port to a specific one of multiple output ports. The input port is connected to each respective one of the output ports via a respective one of multiple switch elements. In MOS-technology (metal-oxide-silicon technology), a switch element is typically implemented with a pass-gate. The control terminals of the pass-gates are driven to supply levels such that a specific one of the pass-gates has low-impedance (pass transistors turned on) and the other pass-gates have high-impedance (pass transistors turned off). Disadvantages of this solution are the dependence of the on-resistance on the supply voltage and on the level of the signal voltage, and the capacitive loading caused by these switch elements on the signal lines.

For multiplexing of high-speed communication signals that are transported via transmission lines, it is preferred that the selected path through the multiplexer causes no, or hardly any, insertion losses and reflection losses. This requires a low parasitic loading capacitance to the signal lines in order to limit discontinuity at high frequencies. Furthermore, the series resistance must be low compared to the characteristic impedance, in order to reduce all-frequency signal attenuation and reflections. The lower the on-resistance and the lower the capacitance, the less impact a multiplexer will have on the signal integrity and the higher will the signal speeds be for which the multiplexer can be used. Lower impact on signal integrity also allows for more multiplexing paths in the multiplexer and/or for multiple cascaded multiplexers. Therefore, it is very interesting to have high-performance switching elements with low on-resistance and low load-capacitance.

In CMOS technologies with multiple gate-oxide thicknesses, it is preferable to use the devices which provide the best bandwidth and best on-resistance versus load capacitance trade-off. This will usually be the thinnest oxide transistors with smallest gate-length but, unfortunately, these devices cannot withstand large voltages across their terminals.

Furthermore, low on-resistance and low capacitance are conflicting requirements as the former implies a larger transistor width and the latter implies a smaller transistor width.

Complementary pass-gates are not very effective, as PMOS devices are weaker than NMOS devices of the same size and using the same bias and, therefore, need to have a larger width and/or more bias to obtain similar on-resistance. Accordingly, unless the PMOS device can have substantially more bias than the NMOS device, increasing the size of a PMOS device increases the load capacitance more than it helps to reduce overall on-resistance and, therefore, penalizes performance.

As an alternative to a pass-gate implemented with both NMOS devices and PMOS devices, an NMOS-only pass-gate can be used. However, for higher signal-levels, the impedance of the NMOS device will increase.

Consider, for example, an MOS-technology with thin-oxide devices for a 1.8V supply voltage and thicker-oxide devices suitable for a 4V supply voltage. A thin-oxide NMOS device, having its gate connected to the 1.8V supply voltage, will not be suitable to pass signal levels with low series-impedance between 0V and 1.8V, due to an insufficient gate drive. Increasing the gate voltage would stress the transistors in case of low signal-voltages and, therefore, compromise life-time and robustness.

Instead, a thick-oxide NMOS device can be applied with a high gate-drive voltage of, for example, 4V. This provides sufficient voltage to keep the transistor of the selected path turned on. However, the on-resistance will vary substantially with the signal level and the thick-oxide device causes substantially higher capacitive loading of the signal lines for the same on-resistance.

SUMMARY OF THE INVENTION

The inventor has recognized that a cause of the varying resistance of a conducting pass-transistor resides in the gate drive of the pass transistor that varies with the signal. Furthermore, capacitive loading is predominantly caused by the transistor which is turned on, as its gate-source capacitance and its gate-drain capacitance (both oxide and overlap capacitances) connect to a fixed voltage.

The inventor therefore proposes, among other things, to let the voltage at the gate of the pass-transistor which is turned on, follow the signal, optionally offset by a voltage shift, instead of connecting it directly to a fixed control-voltage.

More specifically, the inventor proposes a first electronic circuit comprising a first pass-gate with a first voltage-controlled switch. The first pass-gate has a first input node, a first output node and a control node. The first voltage-controlled switch has a first passageway, arranged between the first input node and the first output node, and a first control electrode coupled to the control node. The first pass-gate is operative to selectively open or close the first passageway to a first signal at the first input node under control of a control-voltage at the control node. The first electronic circuit is characterized in that the first pass-gate has control means configured for controlling a first voltage at the first control electrode to substantially follow a second voltage at a particular one of the first input node and the first output node, when the first passageway is open.

For completeness, the feature "control means configured for controlling a first voltage at the first control electrode to substantially follow a second voltage at a particular one of the first input node and the first output node", as specified above, is meant to cover a scenario, wherein the control means is operative to keep a difference between the first voltage and the second voltage to remain substantially constant. Either the first voltage is kept substantially equal to the second voltage, or the first voltage follows the second voltage with a pre-determined non-zero offset. Further down, other configurations will be discussed with control means of similar functionality regarding some voltage following another voltage. The term "following" is to be interpreted in a similar way as explained above.

In an embodiment of the first electronic circuit, the first voltage-controlled switch has a first capacitance between the first input node and the first control electrode, and a second capacitance between the first output node and the first control electrode. The control means comprises a first resistor between the first control electrode and the control node.

The signal voltage at the first input node is capacitively coupled to the first control electrode, and to the first output node. The resistor sees to it that the contribution to the voltage at the first control electrode as a result of the capacitive coupling, does not disappear too rapidly with respect to the dominant frequencies in the signal at the first input node.

The first voltage-controlled switch element is implemented with one or more electronic switches, e.g., one or more field-effect transistors (FETs). As known, a FET has a current channel, whose resistance is controllable through a voltage at the FET's control electrode (gate electrode) and wherein the resistance between the control electrode and the current channel is high enough.

If the passageway and, therefore, the current channel of the switch element, is open, the electrical resistance of the current channel is low. Both the voltage at the first input node and the voltage at the first output node follow the signal. If the first control electrode is biased via a large series-resistance, the capacitances, which are inherently present between the first control electrode and the first input node and between the first control electrode and the first output node, keep the voltage between the first control electrode and the first input node, and the voltage between the first control electrode and the first output node, substantially constant. Therefore, the voltage at the first control electrode follows the signal. In a FET, the inherent capacitances typically include the gate-oxide capacitances (i.e., the gate-source capacitance and the gate-drain capacitance) and overlap capacitances.

As an option, extra capacitors can be connected between the gate and the source and/or the gate and the drain of the FET. However, for many MOS processes the inherent capacitances are sufficient, and provide a low parasitic capacitive load to the first and output nodes. If there is any other capacitance from the gate of the FET to any other node of the circuitry (the other nodes being collectively referred to herein by "substrate") there will be a capacitive voltage division at the gate of the FET. However, the other capacitance can be very low when the FET is conducting, as a result of which the voltage across the gate-oxide is almost constant.

Optionally, the first electronic circuit comprises a clamping switch element for actively coupling at least one of the first control electrode and the control node to a reference voltage under control of a first selection signal, for closing the first passageway.

In the "off"-state of the FET that implements the voltage-controlled switch element of the pass-gate, the switch element preferably provides good isolation and represents a minimal load to the input node. The drain-source resistance of a FET, which is off, is typically high. Isolation for high-frequency signals is therefore mainly determined by the capacitive paths. In this situation, the signal is only at one side of the FET. Note that the gate-drain capacitance in the "off"-state is smaller than the gate-drain capacitance in the "on"-state, because there is no inversion layer in the FET's current channel. Therefore, the FET's oxide capacitance is hardly visible from the source and drain, so that mostly overlap capacitance is remaining. On the other hand, the gate-substrate capacitance in the "off"-state is larger than the gate-substrate capacitance in the "on"-state, as the gate-substrate capacitance is substantially larger in the absence of an inversion layer in the current channel. This makes that in the "off"-state, the gate will not follow the signal, but is subjected to a capacitive voltage division determined by the ratio of the drain-gate capacitance in the "off"-state to the sum of the gate-source capacitance and the gate-substrate capacitance in the "off"-state. In practice, it turns out that for a low control-voltage, this division is large enough to avoid that the FET is turned on by the signal at the input node. This is attractive because this reduces effective parasitic load to the input node and it avoids the need for a low-ohmic pull-down transistor directly at the gate, which would increase the gate-substrate capacitance in the "on"-state. However, this slightly compromises the through-capacitance as there is secondary capacitive path via the gate. If this happens to be relevant to the operation of the pass-gate, a pull-down transistor can be added to the gate to provide a low-ohmic path that breaks the capacitive signal path via the gate in the "off" state.

In a further embodiment of the first electronic circuit in the invention, the control means comprises a voltage level-shifter with a level-shifter input and a level-shifter output. The level-shifter input is coupled to the particular one of the first input node and the first output node for receipt of the second voltage. The level-shifter output is coupled to the control node for supply of the control-voltage. The voltage level-shifter is configured for generating the control-voltage by means of level-shifting a further voltage representative of the second voltage.

For single-ended signals, the control-voltage for the "on"-state is preferably a fixed voltage level-shift with respect to the input signal voltage. Optionally, the input to the level-shifter is obtained from a filter with a time-constant that is smaller than the gate time-constant, determined by the resistance of the first resistor, the gate-drain capacitance and gate source capacitances. For frequencies above the gate roll-off frequency, the gate control-voltage follows the input signal due to gate-drain capacitance and the gate-source capacitance $C_{gs}$ that function as high-pass filters. It is not necessary to make the control follow the high frequencies. The only constraint is that it takes over for lower frequencies, below the roll-off frequency of the gate high-pass filter. Accordingly, the control preferable has a bandwidth larger the gate roll-off frequency, such that the signal at the gate tracks the input signal for all frequencies. This means a control-filter time-constant smaller than the gate time-constant. For single-ended signals without coding constraints, this is important to maintain constant drive for the on-switch. The filter is, for example, implemented using a first-order RC-filter or another low-pass filter. The input impedance of the low-pass filter needs to be high for the signaling frequency range, compared to the termination impedances. The filter makes that the control node only tracks the signal level for frequencies below the cut-off frequency of the filter, while the gate node also tracks the input signal above the gate's roll-off frequency. For a DC-balanced signal which has little low-frequency content, the control-voltage becomes substantially constant.

In a further embodiment, the first electronic circuit comprises a selection circuit for selectively coupling the control node to the resistor under control of a selection signal.

The insights discussed above can also be applied to a pass-gate configuration for a differential signal. More specifically, the invention relates to a second electronic circuit comprising a first pass-gate with a first voltage-controlled switch and a second pass-gate with a second voltage-controlled switch. The first pass-gate has a first input node and a first output node. The first voltage-controlled switch has a first passageway, arranged between the first input node and the first output node, and a first control electrode. The second pass-gate has a second input node and a second output node. The second voltage-controlled switch has a second passageway, arranged between the second input node and the second output node, and a second control electrode. The first control electrode and the second control electrode are coupled to a control node. The first pass-gate is operative to selectively open or close the first passageway to a first signal at the first input node under control of a control-voltage at the control node, and the second pass-gate is operative to selectively open or close the second passageway to a second signal at the second input node under control of the control-voltage at the control node. The second electronic circuit is characterized in that the second electronic circuit has control means configured for controlling a first voltage at the first control electrode to substantially follow a second voltage at a particular one of the first input node and the first output node when the first passageway is open, and for controlling a third voltage at the second control electrode to substantially follow a fourth voltage at a specific one of the second input node and the second output node when the second passageway is open.

In an embodiment of the second electronic circuit the first voltage-controlled switch has a first capacitance between the first input node and the first control electrode, and a second capacitance between the first output node and the first control electrode, and the second voltage-controlled switch has a third capacitance between the second input node and the second control electrode, and a fourth capacitance between the second output node and the second control electrode. The control means comprises a first resistor connected between the first control electrode and another node, and a second resistor connected between the second control electrode and the other node. The other node is coupled to the control node.

In a further embodiment of the second electronic circuit, the control means comprises a voltage level-shifter with a level-shifter input and a level-shifter output, and a third resistor and a fourth resistor, connected in series via a further node between the first input node and the second input node, or between the first output node and the second output node. The level-shifter input is coupled to the further node. The level-shifter output is coupled to the control node for supply of the control-voltage. The voltage level-shifter is configured for generating the control-voltage by means of level-shifting a further voltage present at the further node.

For a differential DC-balanced signal, the control-voltage for the "on"-state is a fixed voltage level-shift with respect to a common-mode voltage of the differential signal. This provides a constant gate-source/drain drive for the switch transistors at any common-mode level. The common-mode voltage of the differential signal is measured without significant signal impact, for example, by means of a high-impedance resistor divider between the first input node and the second input node. The residual current through the gate series resistances due to the differential signal cancel-out and do not go into the level-shifter. As a result, the control node does not have to be low impedance. Therefore, the voltage shift is realized, for example, by means of a level-shift resistor of known resistance and a known current. The level-shift resistor can be high impedance for low-power consumption. A capacitor connected in parallel to the level-shift resistor may be added to improve the higher-frequency common-mode tracking of the control-voltage.

A further embodiment of the second electronic circuit comprises a selection circuit for selectively coupling the control node to the further node under control of a selection signal.

The pass-gate configurations discussed above can be used to implement a multiplexer.

The invention therefore also relates to a third electronic circuit comprising an M×1 multiplexer for multiplexing a number of M single-ended input signals to a single single-ended output signal. The M×1 multiplexer comprises a first number of M multiplexer inputs, a single multiplexer output, and a first number of M first pass-gates. A respective one of the first pass-gates comprises a respective first input node and a respective first output node. The respective first pass-gate has the respective first input node connected to a respective one of the multiplexer inputs. The respective first pass-gate has the respective first output node connected to the single multiplexer output. The respective first pass-gate has a respective first voltage-controlled switch. The respective first voltage-controlled switch has a respective first passageway, arranged between the respective first input node and the respective first output node, and a respective first control electrode. The respective first voltage-controlled switch has a respective first capacitance between the respective first input node and the respective first control electrode, and a respective second capacitance between the respective first output node and the respective first control electrode. The respective first pass-gate has a respective selection circuit configured for control of a respective first voltage at the respective first control electrode in dependence on a respective selection signal in order to selectively open or close the respective first passageway. The third electronic circuit is characterized in that the M×1 multiplexer has control means configured for controlling the respective first voltage at the respective first control electrode to substantially follow a respective second voltage at the respective first output node when the respective first passageway is open. The control means comprises: a control node; a number of M first resistors, and a voltage level-shifter with a level-shifter input and a level-shifter output. A respective one of the first resistors is coupled between the respective first control electrode and the control node. The level-shifter input is coupled to the multiplexer output for receipt of the respective second voltage. The voltage level-shifter is configured for supplying at the level-shifter output a control-voltage by means of level-shifting a respective further voltage representative of the respective second voltage. The level-shifter output is coupled to the control node for supply of the control-voltage. The respective selection circuit is operative to couple the control node to the respective resistor under control of the respective selection signal.

The invention also relates to a fourth electronic circuit comprising a 1×M demultiplexer for demultiplexing a single single-ended input signal into a number of M single-ended output signals. The 1×M demultiplexer comprises a single demultiplexer input, a first number of M demultiplexer outputs and a first number of M first pass-gates. A respective one of the first pass-gates comprises a respective first input node and a respective first output node. The respective first pass-gate has the respective first input node connected to the single demultiplexer input. The respective first pass-gate has the respective first output node connected a respective one of the demultiplexer outputs. The respective first pass-gate has a respective first voltage-controlled switch. The respective first voltage-controlled switch has a respective first passageway, arranged between the respective first input node and the respective first output node, and a respective first control electrode. The respective first voltage-controlled switch has a respective first capacitance between the respective first input node and the respective first control electrode, and a respective second capacitance between the respective first output node and the respective first control electrode. The respective first pass-gate has a respective selection circuit configured for control of a respective first voltage at the respective first control electrode in dependence on a respective selection signal in order to selectively open or close the respective first passageway. The fourth electronic circuit is characterized in that the 1×M demultiplexer has control means configured for controlling the respective first voltage at the respective first control electrode to substantially follow a respective second voltage at the respective first input node when the respective first passageway is open. The control means comprises a control node, a number of M first resistors, and a voltage level-shifter with a level-shifter input and a level-shifter output. A respective one of the first resistors is coupled between the respective first control electrode and the control node. The level-shifter input is coupled to the demultiplexer input for receipt of the respective second voltage. The voltage level-shifter is configured for supplying at the level-shifter output a control-voltage by means of level-shifting a respective further voltage representative of the respective second voltage. The level-shifter output is coupled to the control node for supply of the control-voltage. The respective selection circuit is operative to couple the control node to the respective resistor under control of the respective selection signal.

In embodiments of the third circuit and of the fourth circuit that are implemented with pass-gates of the type that is symmetric with respect to swapping a pass-gate's input node and output node, the third circuit and the fourth circuit have similar configuration and differ only with respect to the origin of the voltages at the control electrodes. In the third circuit with the M×1 multiplexer, the voltages at the control electrodes are configured to selectively follow the voltage at the output node of the M×1 multiplexer. In the fourth circuit with the 1×M demultiplexer, the voltages at the control electrodes are configured to selectively follow the voltage at the input node of the 1×M demultiplexer.

The invention also relates to a fifth electronic circuit comprising an M×1 multiplexer for multiplexing a number of M differential input signals to a single differential output signal. Each respective one of the M differential input signals comprises a respective first input signal and a respective second input signal. The M×1 multiplexer comprises a first number of M first multiplexer inputs, a first number of M second multiplexer inputs, a single first multiplexer output, a single second multiplexer output, a first number of M first pass-gates and a first number of M second pass-gates. A respective one of the first pass-gates comprises a respective first input node and a respective first output node. The respective first pass-gate has the respective first input node connected to a respective one of the first multiplexer inputs. The respective first pass-gate has the respective first output node connected to the single first multiplexer output. The respective first pass-gate has a respective first voltage-controlled switch. The respective first voltage-controlled switch has a respective first passageway, arranged between the respective first input node and the respective first output node, and a respective first control electrode. The respective first voltage-controlled switch has a respective first capacitance between the respective first input node and the respective first control electrode, and a respective second capacitance between the respective first output node and the respective first control electrode. A respective one of the second pass-gates comprises a respective second input node and a respective second output node. The respective second pass-gate has the respective second input node connected to a respective one of the second multiplexer inputs. The respective second pass-gate has the respective second output node connected to the single second multiplexer output. The respective second pass-gate has a respective second voltage-controlled switch. The respective second voltage-controlled switch has a respective second passageway, arranged between the respective second input node and the respective second output node, and a respective second control electrode. The respective second voltage-controlled switch has a respective third capacitance between the respective second input node and the respective second control electrode, and a respective fourth capacitance between the respective second output node and the respective second control electrode. Each respective pair of a respective first pass-gate and a respective second pass-gate has a respective selection circuit. The respective selection circuit is configured for control of a respective first voltage at the respective first control electrode in dependence on a respective selection signal in order to selectively open or close the respective first passageway, and for control of a respective second voltage at the respective second control electrode in dependence on the respective selection signal in order to selectively open or close the respective second passageway. The fifth electronic circuit is characterized in that the M×1 multiplexer has control means configured for controlling the respective first voltage at the respective first control electrode and the respective second voltage at the respective second control electrode in dependence on a respective third voltage, representative of a respective difference between a fourth voltage at the single first multiplexer output and a fifth voltage at the single second multiplexer output when the respective first passageway and the respective second passageway are open. The control means comprises a control node, a number of M first resistors and a number of M second resistors, a third resistor and a fourth resistor, and a voltage level-shifter with a level-shifter input and a level-shifter output. A respective one of the first resistors is connected between the respective first control electrode and a respective other node. A respective one of the second resistors is connected between the respective second control electrode and the respective other node. The respective other node is coupled to the control node. The third resistor and the fourth resistor are connected in series between the single first multiplexer output and the single second multiplexer output via an intermediate node. The level-shifter input is coupled to the intermediate node. The voltage level-shifter is configured for supplying at the level-shifter output a control-voltage by means of level-shifting a further voltage at the intermediate node. The level-shifter output is coupled to the control node for supply of the control-voltage. The respective selection circuit is operative to couple the control node to the respective other node under control of the respective selection signal.

The control voltage at the control node is a filtered and level-shifted version of the common-mode voltage at the differential input signal. The control electrodes are coupled to this control node through resistors to get the correct common-level voltage, while the differential signal is superposed on top of that common-level voltage by means of the high-pass filter, comprising the capacitances between the input nodes and the control electrodes and the capacitances between the output nodes and the control electrodes and comprising the impedance between the control electrodes and the control node. Therefore, the two voltages at the control electrodes for a single differential signal have the same common-mode level which follows the control-node voltage, while the differential voltage between the control electrodes substantially follows the differential output signal of the multiplexer.

The invention also relates to a sixth electronic circuit comprising a 1×M demultiplexer for demultiplexing a single differential input signal into a number of M differential output signals. Each respective one of the M differential input signals comprises a respective first input signal and a respective second input signal. The 1×M demultiplexer comprises a single first demultiplexer input, a single second demultiplexer input, a first number of M first demultiplexer outputs, a first number of M second demultiplexer outputs, a first number of M first pass-gates and a first number of M second pass-gates. A respective one of the first pass-gates comprises a respective first input node and a respective first output node. The respective first pass-gate has the respective first input node connected to the single first demultiplexer input. The respective first pass-gate has the respective first output node connected a respective one of the first demultiplexer outputs. The respective first pass-gate has a respective first voltage-controlled switch. The respective first voltage-controlled switch has a respective first passageway, arranged between the respective first input node and the respective first output node, and a respective first control electrode. The respective first voltage-controlled switch has a respective first capacitance between the respective first input node and the respective first control electrode, and a respective second capacitance between the respective first output node and the respective first control electrode. A respective one of the second pass-gates comprises a respective second input node and a respective second output node. The respective second pass-gate has the respective second input node connected the single second demultiplexer input. The respective second pass-gate has the respective second output node connected to a respective one of the second demultiplexer outputs. The respective second pass-gate has a respective second voltage-controlled switch. The respective second voltage-controlled switch has a respective second passageway, arranged between the respective second input node and the respective second output node, and a respective second control electrode. The respective second voltage-controlled switch has a respective third capacitance between the respective second input node and the respective second control electrode, and a respective fourth capacitance between the respective second output node and the respective second control electrode. Each respective pair of a respective first pass-gate and a respective second pass-gate has a respective selection circuit. The respective selection circuit is configured for control of a respective first voltage at the respective first control electrode in dependence on a respective selection signal in order to selectively open or close the respective first passageway, and for control of a respective second voltage at the respective second control electrode in dependence on the respective selection signal in order to selectively open or close the respective second passageway. The sixth electronic circuit is characterized in that the 1×M demultiplexer has control means configured for controlling the respective first voltage at the respective first control electrode and the respective second voltage at the respective second control electrode in dependence on a respective third voltage, representative of a respective difference between a fourth voltage at the single first multiplexer input and a fifth voltage at the single second multiplexer input when the respective first passageway and the respective second passageway are open. The control means comprises a control node, a number of M first resistors and a number of M second resistors, a third resistor and a fourth resistor, and a voltage level-shifter with a level-shifter input and a level-shifter output. A respective one of the first resistors is connected between the respective first control electrode and a respective other node. A respective one of the second resistors is connected between the respective second control electrode and the respective other node. The respective other node is coupled to the control node. The third resistor and the fourth resistor are connected in series between the single first multiplexer input and the single second multiplexer input via an intermediate node. The level-shifter input is coupled to the intermediate node. The voltage level-shifter is configured for supplying at the level-shifter output a control-voltage by means of level-shifting a further voltage at the intermediate node. The level-shifter output is coupled to the control node for supply of the control-voltage. The respective selection circuit is operative to couple the control node to the respective other node under control of the respective selection signal.

The control voltage at the control node is a filtered and level-shifted version of the common-mode voltage at the differential input signal. The control electrodes are coupled to this control node through resistors to get the correct common-level voltage, while the differential signal is superposed on top of that common-level voltage by means of the high-pass filter, comprising the capacitances between the input nodes and the control electrodes and the capacitances between the output nodes and the control electrodes and comprising the impedance between the control electrodes and the control node. Therefore, the two voltages at the control electrodes for a single differential signal have the same common-mode level which follows the control-node voltage, while the differential voltage between the control electrodes substantially follows the differential input signal to the demultiplexer.

A reason for considering M×1 multiplexers as well as 1×M demultiplexers here, is that an M×N multiplexer can be considered, as known in the art, an arrangement of a number of N M×1 multiplexers or an arrangement of M 1×N demultiplexers.

The invention therefore also relates to a seventh electronic circuit comprising an M×N multiplexer with a first number of M multiplexer inputs and a second number of N multiplexer outputs and configured for multiplexing a number of M single-ended input signals. If M is larger than N, the M×N multiplexer has a modular configuration comprising N modules. A respective one of the N modules comprises a respective third electronic circuit comprising a respective M×1 multiplexer, as specified above, for multiplexing the M single-ended input signals to a respective one of the N multiplexer outputs. On the other hand, if N is larger than M, the M×N multiplexer has a modular configuration comprising M modules. A respective one of the M modules comprises a respective fourth electronic circuit comprising a respective 1×N demultiplexer, as specified above, for demultiplexing a respective one of the single-ended input signals to the N multiplexer outputs.

Likewise, the invention also relates to an eighth electronic circuit comprising an M×N multiplexer with a first number of M multiplexer inputs and a second number of N multiplexer outputs, and configured for multiplexing a number of M differential input signals. M and N are integers. If M is larger than N, the M×N multiplexer has a modular configuration comprising N modules. A respective one of the N modules comprises a respective fifth electronic circuit comprising a respective M×1 multiplexer, as specified above, for multiplexing the M differential input signals to a respective one of the N multiplexer outputs. If N is larger than M, the M×N multiplexer has a modular configuration comprising M modules. A respective one of the M modules comprises a respective sixth electronic circuit comprising a respective 1×N demultiplexer, as specified above, for demultiplexing a respective one of the differential input signals to the N multiplexer outputs.

Consider configuring an M×N multiplexer according to the invention as N modules with an M×1 multiplexer each, M being larger than N. Such a configuration has individual control means per individual one of the N modules, i.e., a number of N control means. If the M×N multiplexer was configured as M modules with an 1×N demultiplexer each, the M×N multiplexer would need M individual control means. As M is larger than N, the former configuration needs fewer control means than the latter. If N is larger than M, it may be advisable to configure the M×N multiplexer as M modules with a 1×N demultiplexer each for a similar reason.

BRIEF DESCRIPTION OF THE DRAWINGS

The invention is explained in further detail, by way of example and with reference to the accompanying drawing, wherein.

Throughout the Figures, similar or corresponding features are indicated by same reference numerals.

LEGEND

Figure 1:
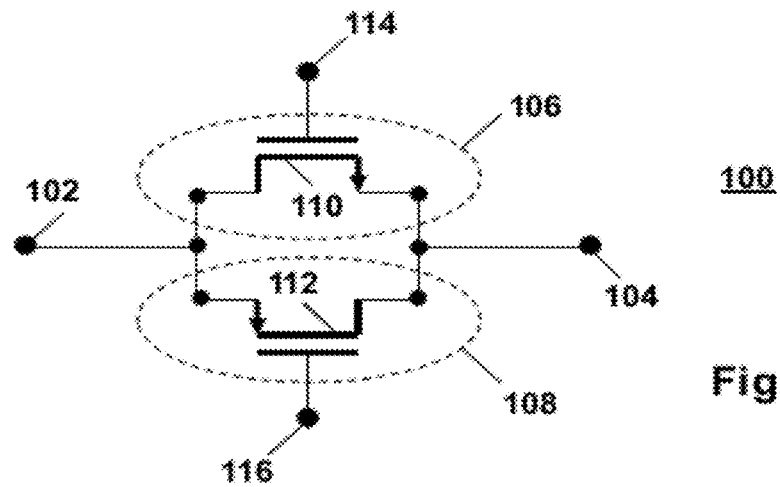
FIGS. 1 and 2 are diagrams of conventional pass-gates.

100: conventional pass-gate
102: first input node
104: first output node
106: first FET, NMOS device
108: second FET, PMOS device
110: first current channel of first FET
112: second current channel of second FET
114: first control electrode (gate) of first FET
116: second control electrode (gate) of second FET
200: second conventional pass-gate
300: first embodiment of pass-gate configuration in invention
302: gate-drain capacitance of first FET
304: gate-source capacitance of first FET
306: resistor
308: control node
402: drain-source resistance of first NMOS device
404: gate-drain capacitance of first NMOS device
406: gate-source capacitance of first NMOS device
408: substrate
410: gate-substrate capacitance of first NMOS device
412: drain-substrate capacitance of first NMOS device
414: source-substrate capacitance of first NMOS device
416: drain-source capacitance of first NMOS device
500: second embodiment of pass-gate configuration in invention
502: pull-down transistor
504: pull-up transistor
600: third embodiment of pass-gate configuration in invention
602: control means
604: first-order low-pass filter
606: unity-gain amplifier
608: voltage source
610: third resistor
612: capacitor of low-pass filter
614: selection circuit
700: further embodiment as alternative to third embodiment
800: fourth embodiment of pass-gate configuration in the invention
802: second NMOS device
804: second gate of second NMOS device
806: second current channel of NMOS device
808: second input node
810: second output node
812: second resistor
814: fourth resistor
816: further node between third resistor and fourth resistor
900: variation on the fourth embodiment
902: fifth resistor
904: sixth resistor
906: other further node between fifth resistor and sixth resistor
1000: fifth embodiment of pass-gate configuration in invention
1002: level-shift resistor
1004: current source
1006: capacitor
1100: 3×2 multiplexer
1102: first input
1104: second input
1106: third input
1108: first output
1110: second output
1112: first switch
1114: second switch
1116: third switch
1118: fourth switch
1120: fifth switch
1122: sixth switch
1202: first 3×1 multiplexer 1204: second 3×1 multiplexer
1302: first 1×2 demultiplexer
1304: second 1×2 demultiplexer
1306: third 1×2 demultiplexer
1400: sixth embodiment of pass-gate configuration in invention forming a demultiplexer
1402: third NMOS device
1404: fourth NMOS device
1406: seventh resistor
1408: eighth resistor
1410: third output node
1412: fourth output node
1414: second selection circuit
1500: more detailed implementation the demultiplexer in the sixth embodiment
1502: reference current source
1504: current mirror
1506: fifth NMOS device
1508: reference resistor
1510: differential amplifier
1600: control topology of a 3×1 multiplexer
1602: first input node of 3×1 multiplexer
1604: second input node of 3×1 multiplexer
1606: third input node of 3×1 multiplexer
1608: output node of 3×1 multiplexer
1610: first pass-gate of 3×1 multiplexer
1612: second pass-gate of 3×1 multiplexer
1614: third pass-gate of 3×1 multiplexer
1616: control means of 3×1 multiplexer
1617: control node
1618: first selection circuit
1620: second selection circuit
1622: third selection circuit
1700: control topology of a 1×2 demultiplexer
1702: input node of 1×2 demultiplexer
1704: first output node of 1×2 demultiplexer
1706: second output node of 1×2 demultiplexer
1708: first pass-gate of 1×2 demultiplexer
1710: second pass-gate of 1×2 demultiplexer
1712: control means of 1×2 demultiplexer
1714: control node
1716: first selection circuit of 1×2 demultiplexer
1718: second selection circuit of 1×2 demultiplexer
1800: control topology of a 3×2 multiplexer
1802: first 3×1 multiplexer
1803: second 3×1 multiplexer
1804: first input node of the first 3×1 multiplexer
1806: second input node of the first 3×1 multiplexer
1808: third input node of the first 3×1 multiplexer
1810: first output node of the first 3×1 multiplexer
1812: first pass-gate of the first 3×1 multiplexer
1814: second pass-gate of the first 3×1 multiplexer
1816: third pass-gate of the first 3×1 multiplexer
1818: fourth input node of the second 3×1 multiplexer
1820: fifth input node of the second 3×1 multiplexer
1822: sixth input node of second 3×1 multiplexer
1824: second output node of second 3×1 multiplexer
1826: fourth pass-gate of second 3×1 multiplexer
1828: fifth pass-gate of second 3×1 multiplexer
1830: sixth pass-gate of second 3×1 multiplexer
1832: first control means of first 3×1 multiplexer
1834: first control node of first 3×1 multiplexer
1836: first selection circuit of first 3×1 multiplexer
1838: second selection circuit of first 3×1 multiplexer
1840: third selection circuit of first 3×1 multiplexer
1842: second control means of second 3×1 multiplexer
1844: second control node of second 3×1 multiplexer
1846: fourth selection circuit of second 3×1 multiplexer
1848: fifth selection circuit of second 3×1 multiplexer
1850: sixth selection circuit of second 3×1 multiplexer

DETAILED EMBODIMENTS

FIG. 1 is a diagram of a first conventional pass-gate 100 for controlling the passage of a signal at a first input node 102 to a first output node 104 under control of a control-voltage. The first conventional pass-gate 100 comprises a first field effect transistor (FET) 106 and a second FET 108. The first FET 106 is of an N-channel conductivity type, e.g., an NMOS FET, and the second FET 108 is of a P-channel conductivity type, e.g., a PMOS FET. The first FET 106 has a first current channel 110, and the second FET has a second current channel 112. The first current channel 110 and the second current channel 112 are connected in parallel between the first input node 102 and the first output node 104. The first FET 106 has a first control electrode 114, and the second FET has a second control electrode 116. Typically, the first control electrode 114 and the second control electrode 116 receive logically complementary control-voltages to render the first current channel 110 and the second current channel 112 either both conducting or both blocking.

As mentioned earlier, the first conventional pass-gate 100 is, if implemented in CMOS, not very effective, as the PMOS FET 108 is slower than the NMOS FET 106 and needs to have a much larger width or bias to obtain similar on-resistance as the NMOS FET 106. If, for the same bias, the size of a PMOS FET is increased, the total load capacitance substantially increases before the on-resistance significantly decreases.

Figure 2:
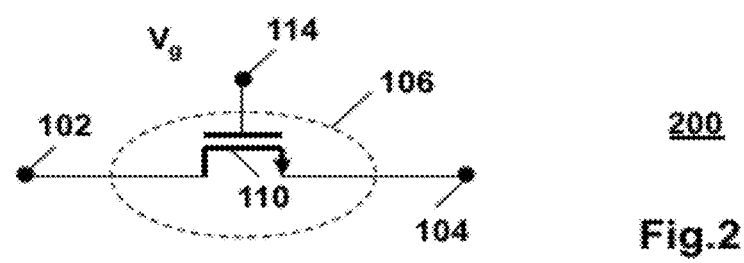

FIG. 2 is a diagram of a second conventional pass-gate 200, using only the NMOS FET 106. The NMOS FET 106 receives a control-voltage $V_g$ at its control electrode 114 for selectively rendering the current channel 110 electrically conductive or blocking. As mentioned above, the NMOS FET 106 can be implemented with a thin-oxide device and having the first control electrode selectively connected to a suitably low supply voltage, e.g., $V_{dd}$=1.8V. Such a single, thin-oxide NMOS device is not suitable for passing all signal levels up to $V_{dd}$ with low series-impedance, due to an insufficient gate drive for the higher signal levels. Increasing the gate voltage would stress the thin-oxide device in case of low signal-voltages and, therefore, compromise service life and robustness. Alternatively, the NMOS FET 106 can be implemented with a thick-oxide NMOS device having a high gate-drive voltage in the range of, for example, 3V-4V. This provides sufficient voltage to keep the NMOS device conducting for all signal levels up to, for example, 1.8V. However, the on-resistance will vary substantially with the level of the signal to be passed, and the thick-oxide device causes substantially higher capacitive loading of the signal lines for the same on-resistance.

In a pass-gate according to the invention, the control-voltage at the control electrode of the pass transistor, which is turned on, is made to follow the signal at the input node.

Figure 3:
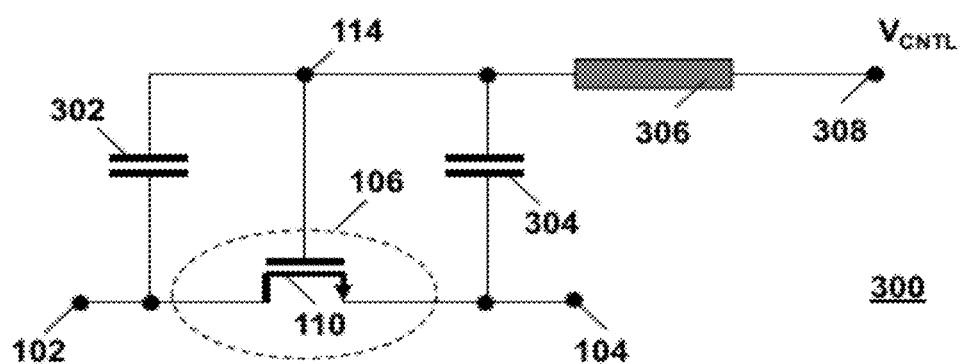
FIGS. 3 and 4 are diagrams of a first embodiment of a pass-gate configuration in the invention.
Figure 4:
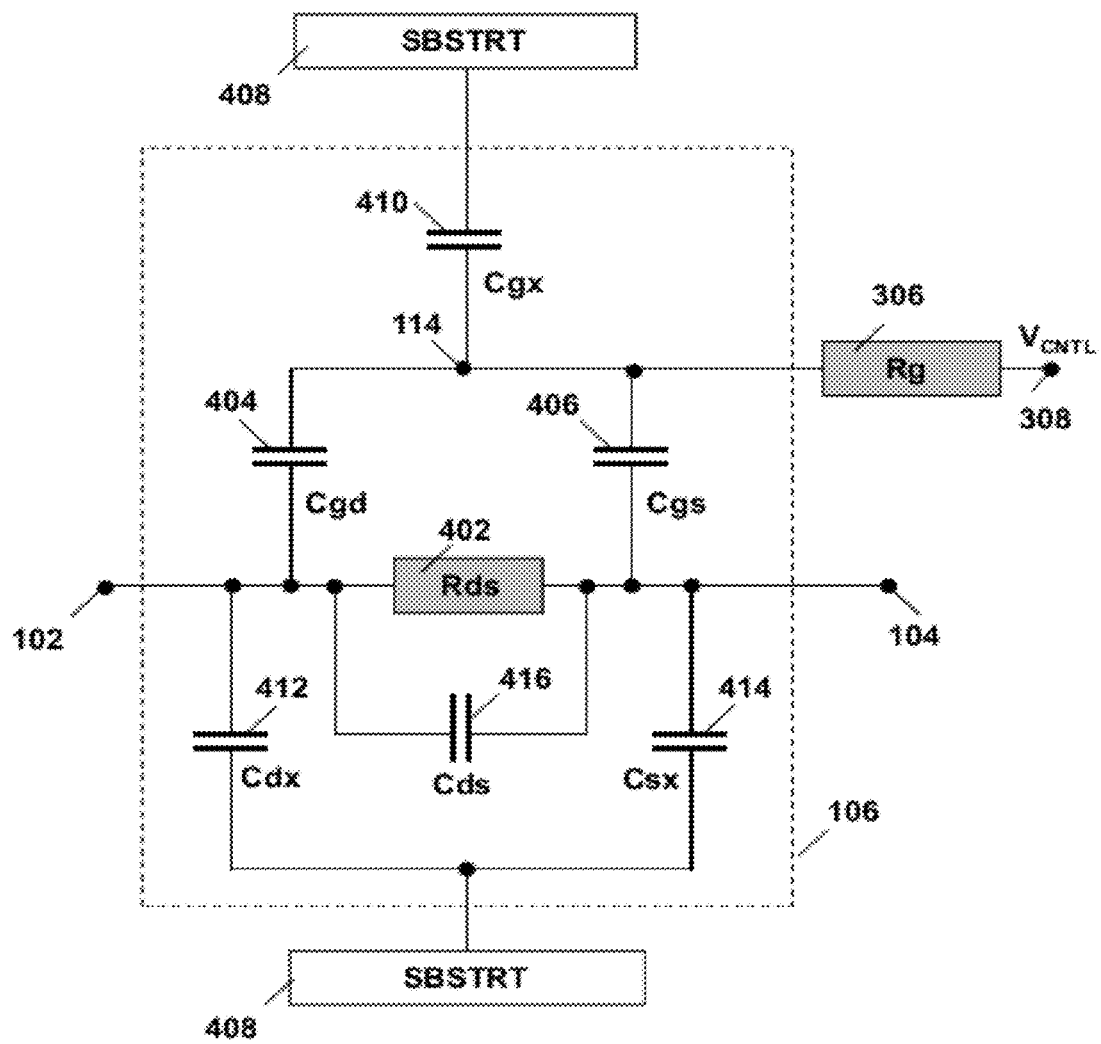

FIGS. 3 and 4 are diagrams of a first embodiment 300 of a pass-gate configuration in the invention. The first embodiment 300 comprises a first capacitance 302 between the first input node 102 and the control electrode 114, a second capacitance 304 between the first output node 104 and the control electrode 114, and a resistor 306 between the control electrode 114 and a control node 308. The control node 308 receives the control-voltage $V_{CNTR}$ from an external source (not shown) for selectively having the current channel 110 in a conducting state or in a blocking state.

Assume that the control-voltage $V_{CNTR}$ is set to "high" in order to render the current channel 110 electrically conductive. A signal at the first input node 102 then propagates through the current channel 110 to the first output node 104. In addition, the first input node 102 and the first output node 104 are coupled via the first capacitance 302 and the second capacitance 304. If the resistance of the resistor 306 is large enough, the signal at the first input node 102 causes the voltage at the control electrode 114 to change accordingly owing to the capacitive coupling to the control electrode 114 via the first capacitance 302 and the second capacitance 304. As a result, the control-voltage at the control electrode 114 follows the signal at the first input node 102. This is explained in more detail below with reference to FIG. 4.

It is assumed that the first transistor 106 is an NMOS device. In accordance with convention, the term "drain" will be used below to indicate the terminal of the first transistor 106 connected to the first input node 102, the term "source" will be used below to indicate the terminal of the first transistor 106 connected to the first output node 104 and the term "gate" will be used below to indicate the control electrode 114. However, note that the choice of what terminal in the current path of an MOS device is to be used as the drain and what other terminal in the current path of the MOS device is to be used as the source is arbitrary, as the function of the drain and the function of the source are interchangeable for an MOS device.

FIG. 4 is a diagram illustrating the relevant capacitances and resistance of the NMOS device 106 in the first embodiment 300 of FIG. 3. The current channel 110 of the NMOS device 106 is represented by a drain-source resistance 402 of magnitude Rds. The first capacitance 302 is represented by a gate-drain capacitance 404 between the gate 114 and the drain of the NMOS device 106 and is internal to the NMOS device 106. The gate-drain capacitance 404 has a magnitude Cgd. The second capacitance 304 is represented by a gate-source capacitance 406 between the gate 114 and the source of the NMOS device 106, and is also internal to the NMOS device 106. The gate-source capacitance 406 has a magnitude Cgs.

The gate 114 of the NMOS device 106 is further coupled to the substrate 408 via an internal capacitance 410 of magnitude Cgx. The drain of the NMOS device 106 is coupled to the substrate 408 via an internal capacitance 412 of magnitude Cdx. The source of the NMOS device 106 is coupled to the substrate 408 via an internal capacitance 414 of magnitude Csx, The drain and the source of the NMOS device 106 are coupled via an internal capacitance 416 of magnitude Cds.

If the NMOS device 106 receives, from the control node 308 and via the resistor 306, a high control-voltage at the gate 114, the NMOS device 106 is turned on. When the current channel 110 is conducting, the magnitude Rds of the resistance 402 is low, and both the first input node 102 and the first output node 104 follow the signal present at the first input node 102. If the gate 114 receives the control-voltage $V_{CNTL}$ via the resistor 306 of high-enough resistance Rg, the gate-drain capacitance 404 and the gate-source capacitance 406, which are implicitly present, will keep the voltage between the gate 114 and the first input node 102 and the voltage between the gate 114 and the first output node 104 substantially constant. Therefore, the voltage at the gate 114 follows the signal.

Optionally, additional capacitors may be added between the gate 114 and the source and/or between the gate 114 and the drain. However, for many MOS processes the gate-drain capacitances and the gate-source capacitances that are implicitly present in the NMOS device 106 are sufficient for the purpose of the invention, and result in a low parasitic capacitive load to the first input node 102 and the first output node 104.

The capacitance 410 between the gate 114 and the substrate 408 may cause a capacitive voltage-division. However, the capacitance 410 is typically very low if the NMOS device 106 is turned on. Accordingly, the voltage across the gate-oxide is almost constant.

The above implies that capacitances between, on the one hand, the signal path from the first input node 102 to the first output node 104 and, on the other hand, the gate 114 are hardly charged and discharged, and therefore do not form a significant load on the signal lines.

The voltage-shift level can be chosen in advance and, therefore, it is possible to use thin-oxide devices wherein the voltage at the gate 114 with respect to the voltage at the source and the voltage at the drain, can be set to the maximum allowed voltage for these devices. Typically, the gate-substrate capacitance 410 can withstand a much higher voltage, so the absolute magnitude of the gate-voltage can go beyond the maximum supply voltage allowed for these devices.

The cut-off frequency of the first embodiment 300 depends on the magnitude of the resistance of the resistor 306, and on the magnitudes of the gate-drain capacitance 404 and of the gate-source capacitance 406. The voltage at the gate 114 follows the signal for signal frequencies significantly higher than the cut-off frequency. The voltage at the gate 114 follows the control-voltage $V_{CNTL}$ for signal frequencies significantly lower than the cut-off frequency.

In order to ensure that the voltage at the gate 114 properly follows the signal at the first input node 102 and the first output node 104, the signal preferably does not have significant signal components of frequencies below the cut-off frequency. This implies that the signal preferably has a certain level of DC-balance. Alternatively, the low-frequency content of the signal can be tracked and provided via the generation of the control-voltage $V_{CNTL}$.

Consider a multiplexer using two or more pass-gates, e.g., each thereof configured as in the first embodiment 300.

In case the pass-gate in the invention is turned off, i.e., if the control-voltage $V_{CNTL}$ is low, the pass-gate turned off preferably provides good isolation and adds minimal loading to the node which is shared with the selected signal path through the multiplexer.

The resistance between the drain and the source of a MOSFET that is turned-off is typically high. Isolation for high-frequency signals is therefore mainly determined by the capacitive couplings. In this situation, the signal is only at one side of the NMOS device 106, namely at the first input node 102.

It is noted here that the magnitude of the gate-drain capacitance 404 and the magnitude of the gate-source capacitance 406 each depend on whether the NMOS device 106 is turned on or turned off. If the NMOS device 106 is turned off, the magnitude of the gate-drain capacitance 404 is lower than the magnitude of the gate-drain capacitance 404 in case the NMOS device 106 has been turned on. Similarly, if the NMOS device 106 is turned off, the magnitude of the gate-source capacitance 406 is lower than the magnitude of the gate-source capacitance 406 in case the NMOS device 106 has been turned on. This dependence of the capacitance values on the state of the NMOS device 106 stems from the fact that there is no inversion layer in the current channel 110 when the NMOS device 106 is turned off. Therefore, the MOS oxide-capacitances, effectively visible from the source and from the drain, become much lower so that mostly overlap capacitances remain.

The magnitude of the gate-substrate capacitance 410, on the other hand, is higher when the NMOS device 106 is turned off than when the NMOS device 106 is turned on. That is, in the absence of the inversion layer in the current channel 110, the gate-substrate capacitance 410 is substantially larger than when the inversion layer is present. As a result, the voltage at the gate 114 will not fully follow the signal at the first input node 102 if the NMOS device 106 is turned off, but is divided capacitively. The capacitive division of the voltage at the gate 114 is brought about by the gate-drain capacitance 404 being connected to a parallel arrangement of the gate-substrate capacitance 410 and the gate-source capacitance 406.

If a low control-voltage $V_{CNTL}$ is being used, this division is large enough in practice to avoid that the NMOS device 106 is turned on by the signal at the first input node 102. As a result, the effective parasitic load on the selected signal path is reduced.

If the voltage division is not large enough, so that the NMOS device 106 turns on due to the residual capacitive coupling to the gate 114 or so that the capacitive feed-through coupling between the first input node 102 and the first output node 104 is too high, a gate pull-down transistor can be used, so as to provide a low-ohmic path that breaks the capacitive signal path via the gate 114 when the NMOS device 106 is turned off. This is discussed in further detail with reference to FIG. 5.

Figure 5:
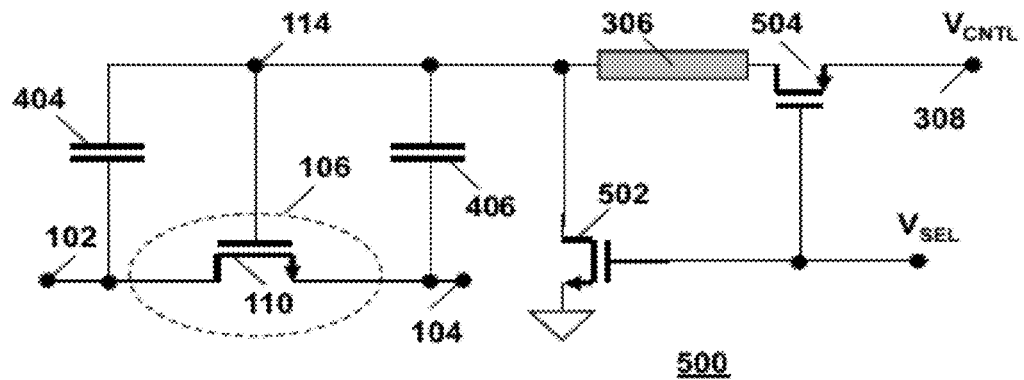
FIG. 5 is a diagram of a second embodiment of a pass-gate configuration in the invention.

FIG. 5 illustrates a second embodiment 500 of a pass-gate configuration in the invention. The second embodiment 500 comprises a pull-down transistor 502 and a pull-up transistor 504. A current channel of the pull-down transistor 502 is coupled between the gate 114 and ground. A current channel of the pull-up transistor 504 is coupled to the control node 308 receiving the voltage $V_{CNTL}$ and is coupled to the gate 114 via the resistor 306. The pull-down transistor 502 and the pull-up transistor 504 are controlled so that one of the pull-down transistor 502 and the pull-up transistor 504 is conductive and the other one of the pull-down transistor 502 and the pull-up transistor 504 is blocking. For example, the pull-down transistor 502 is an NMOS device and the pull-up transistor 504 is a PMOS device, which have their respective gates connected together for receipt of a selection signal $V_{SEL}$. In this case, the control-voltage $V_{CNTL}$ may have a fixed voltage and does not have to be controlled to selectively assume either a high value or a low value.

In the example shown in FIG. 5, the current channel of the pull-down transistor 502 is connected to the gate 114, and the pull-up transistor 504 is connected between the control node 308 and the resistor 306. In an alternative embodiment of the example shown in FIG. 5, the pull-down transistor 502 has its current channel connected to the current channel of the pull-up transistor 504, as is illustrated in the selection circuit 614 in the diagram of FIG. 6, discussed below. Note that in the former configuration, the gate-drain capacitance 404 and the gate-source capacitance 406 can be discharged more rapidly than in the latter configuration, as the resistor 306 is not located in the discharge path in the former configuration. However, connecting the pull-down transistor 502 to the gate 114 increases the capacitance between the gate 114 and the substrate 408 (parallel to the gate-substrate capacitance 410) if the current channel 110 of the NMOS device 106 is conducting. In the further embodiments of the pass-gate configurations, discussed below, the alternative implementation of the selection circuit 614 will be used. Note that the implementation shown in FIG. 5 can be used instead.

Figure 6:
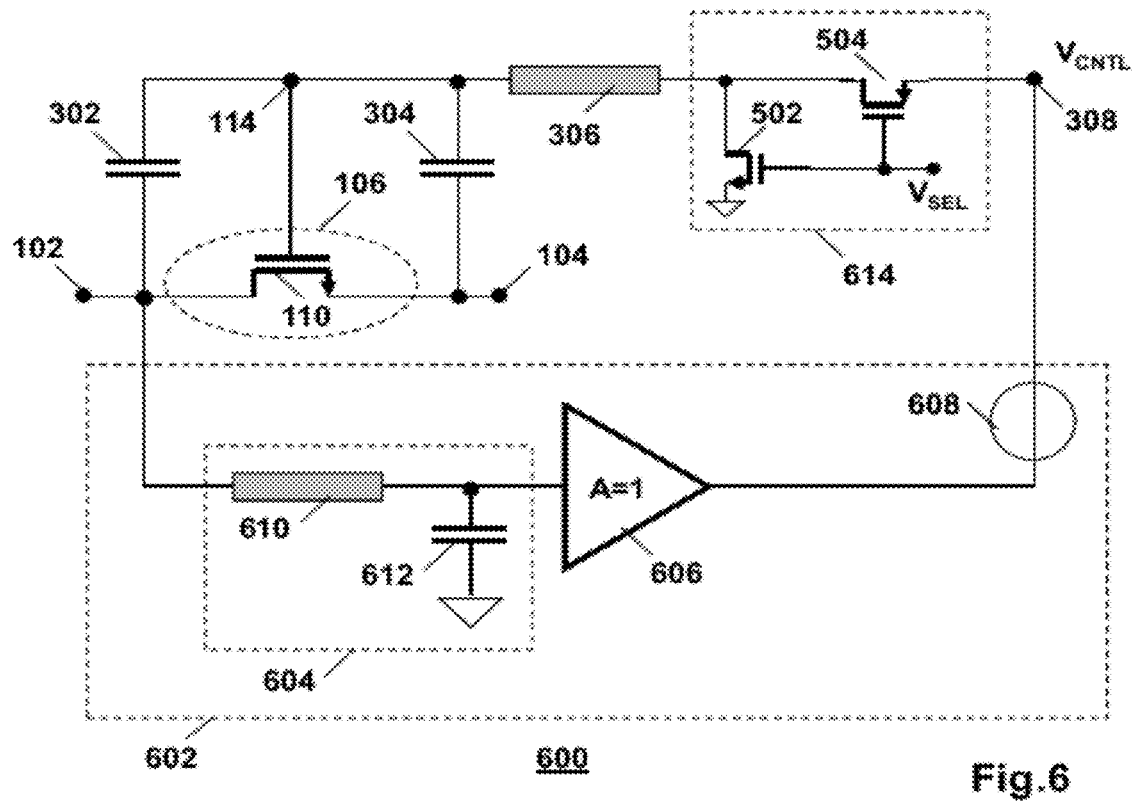
FIG. 6 is a diagram of a third embodiment of a pass-gate configuration in the invention.

FIG. 6 is a diagram of a third embodiment 600 of a pass-gate configuration in the invention. In the third embodiment 600, the pull-up transistor 504 and the pull-down transistor 502, discussed above as the alternative embodiment of the example in FIG. 5, have their drains connected and receive the selection signal $V_{SEL}$ for controllably enabling or disabling the NMOS device 106. In addition, the third embodiment 600 comprises control means 602 for maintaining the voltage at the gate 114 at a fixed level with respect to a low-pass-filtered signal voltage at the first input node 102 when the NMOS device 106 is conducting. The control means 602 comprises, e.g., a first-order low pass filter 604, and a voltage level-shifter, conceptually represented in the diagram of FIG. 6 by a unity-gain amplifier 606 and a voltage source 608. The first-order low-pass filter 602 has a filter input connected to the first input node 102, and a filter output connected to an amplifier input of the unity-gain amplifier 606. The unity-gain amplifier 606 has an amplifier output connected to the control node 308 via the voltage source 608. The first-order low-pass filter 602 comprises a third resistor 610 between the first input node 102 and the input of unity-gain amplifier 606, and a capacitor 612 between the input of the unity-gain amplifier 606 and ground. Preferably, the third resistor 610 has a large enough resistance value so as to avoid adding a significant load to the first input node 102.

When the NMOS device 106 is conducting, the control-voltage $V_{CNTL}$ at the control node 308 is a fixed voltage level-shift with respect to the filtered signal voltage at the first input node 102. The filtering is implemented by the first-order low-pass filter 604, whose time constant is smaller than the product of the resistance value of the resistor 306 and the capacitance value of the total of all capacitances seen from the gate 114. This ensures that the gate 114 tracks the signal level at the first input node 102 for all frequencies. For a DC-balanced signal with minor low-frequency content, the control-voltage $V_{CNTL}$ becomes substantially constant if the cut-off frequency of the low-pass filter 604 is chosen below the high-pass corner frequency of the coding scheme.

An arrangement of the pull-up transistor 504 and the pull-down transistor 502 will be referred to below as a "selection circuit", here indicated by reference numeral 614.

Figure 7:
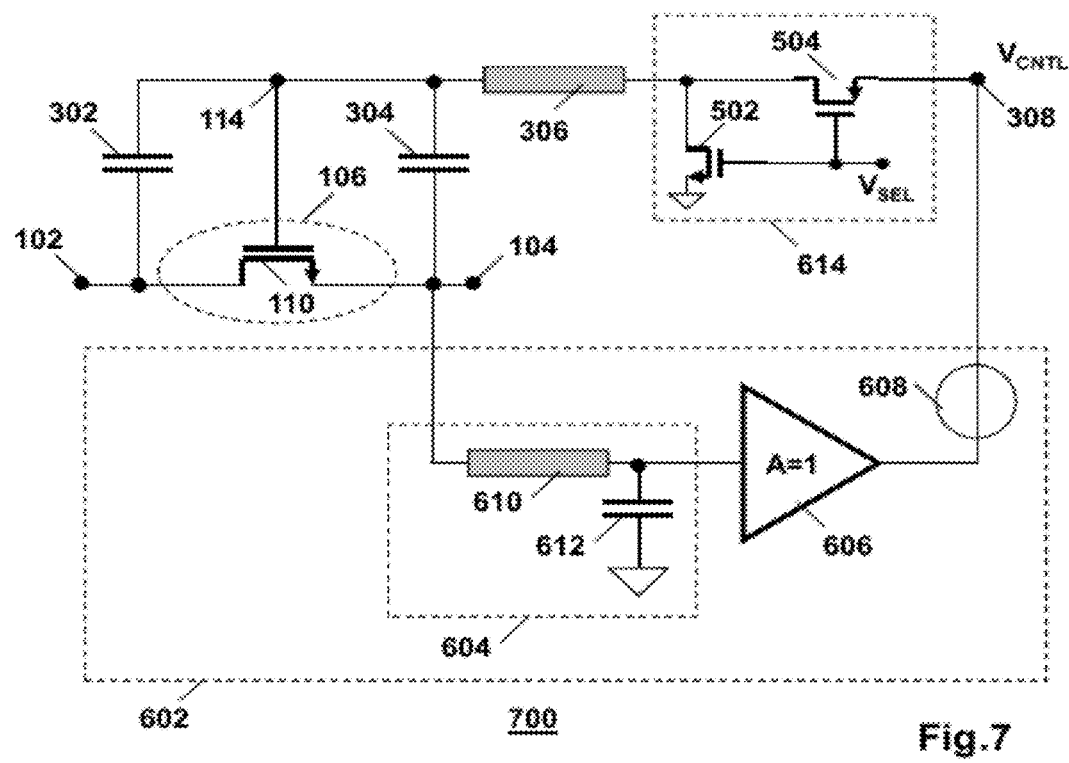
FIG. 7 is a diagram of a further embodiment as an alternative to the third embodiment of FIG. 6.

FIG. 7 is a diagram of a further embodiment 700 as an alternative to the third embodiment 600 of FIG. 6. The third resistor 610 is now connected between the input of the unity-gain amplifier 606 and the first output node 104. The control-voltage $V_{CNTL}$ is now derived from the signal at the first output node 104, instead of from the signal at the first input node 102 as in the third embodiment 600 of FIG. 6.

Figure 8:
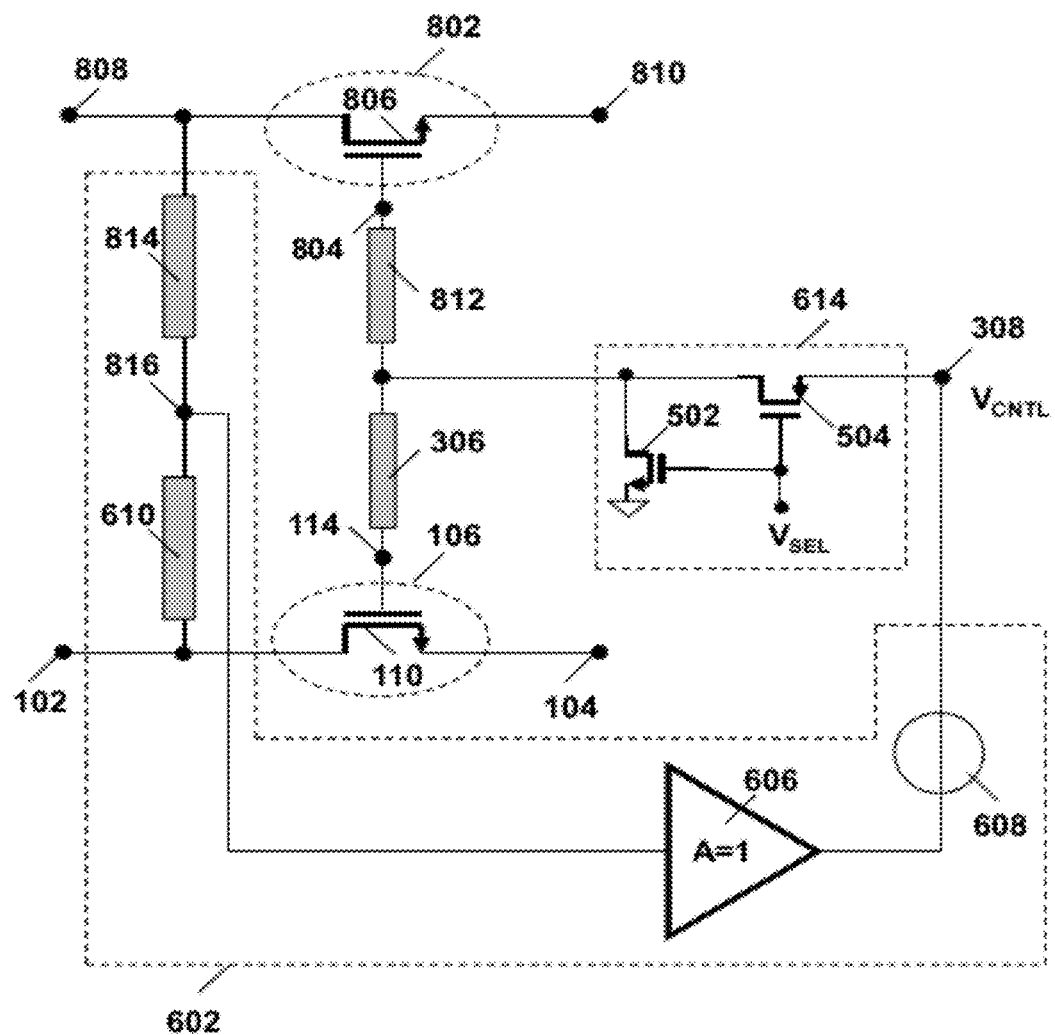
FIG. 8 is a diagram of a fourth embodiment of a pass-gate configuration in the invention.
Figure 9:
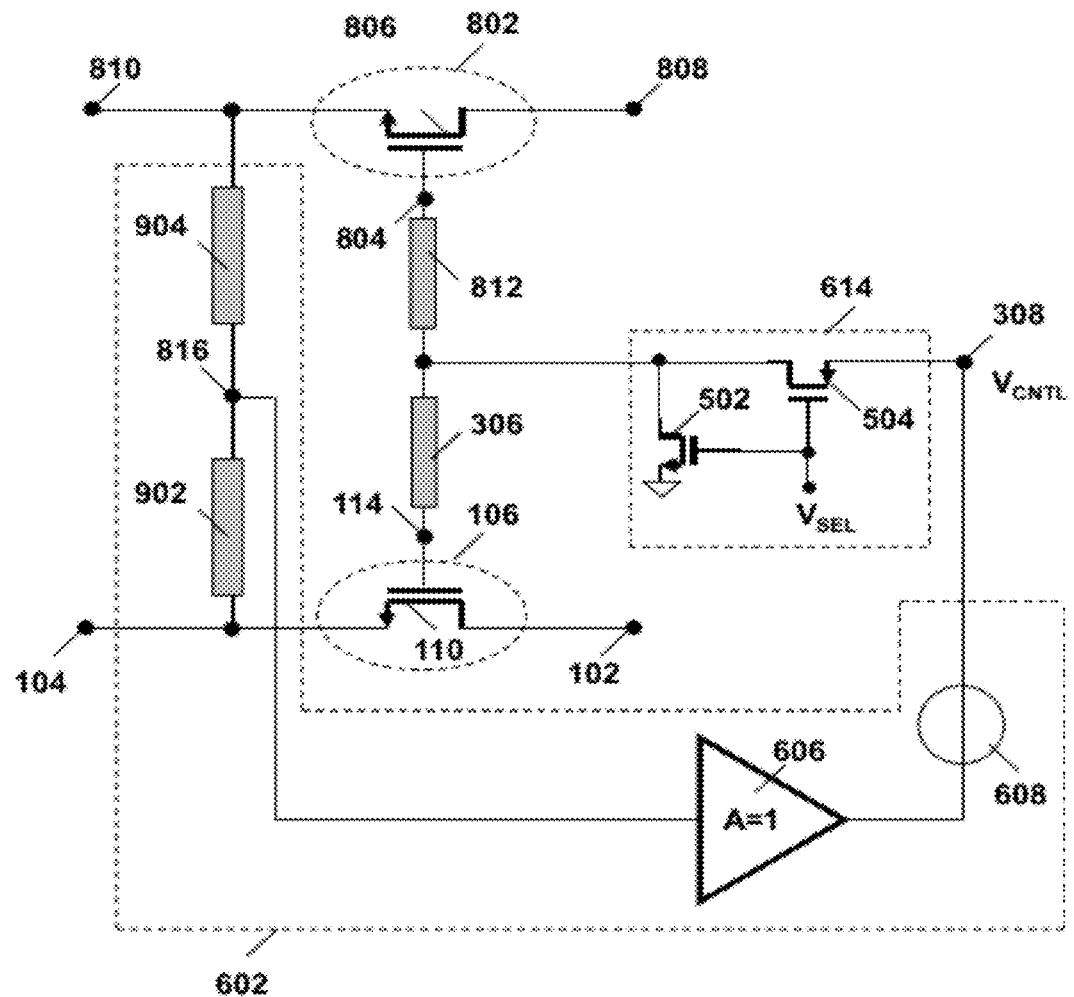
FIG. 9 is a diagram of a variation on the theme of the fourth embodiment of FIG. 8.
Figure 10:
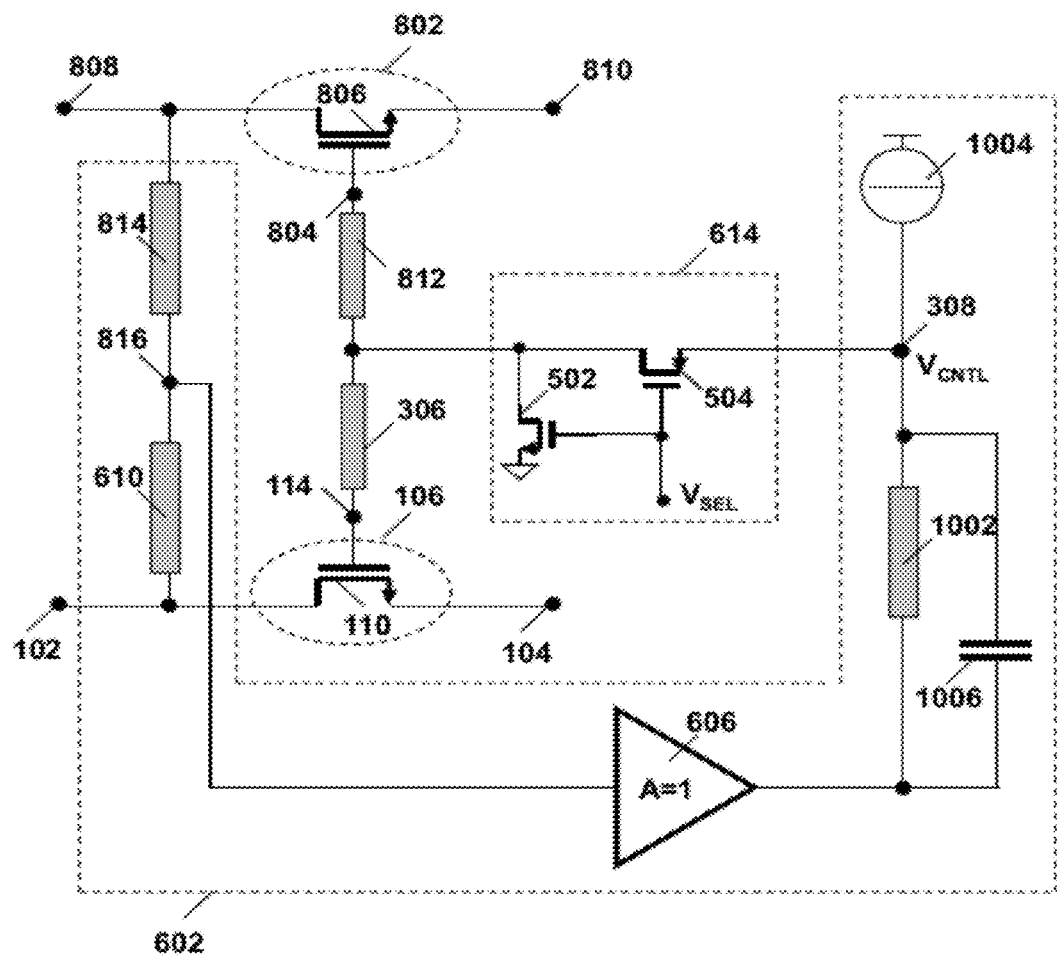
FIG. 10 is a diagram of a fifth embodiment of a pass-gate configuration in the invention.

The diagrams of FIGS. 1-7 illustrate single-ended signal switching. FIGS. 8-10, discussed below, illustrate embodiments of pass-gate configurations for differential-signal switching.

FIG. 8 is diagram of a fourth embodiment 800 of a pass-gate configuration according to the invention. The fourth embodiment 800 is configured for switching differential signals. The fourth embodiment 800 comprises the third embodiment 600 of FIG. 6, minus the capacitor 612 but including additional components in order to process differential signals. A reason for omitting the capacitor 612 is discussed below. In addition to the components of the third embodiment 600 of FIG. 6, the fourth embodiment 800 comprises a second NMOS device 802. The second NMOS device 802 comprises a second gate 804, and a second current channel 806 connected between a second input node 808 and a second output node 810. The second gate 804 is connected to a second resistor 812. The resistor 306 and the second resistor 812 are connected in series between the first gate 114 of the first NMOS device 106 and the second gate 804 of the second NMOS device 802. The selection circuit 614 is connected between the control node 308 and a further node between the resistor 306 and the second resistor 812. Accordingly, the first NMOS device 106 and the second NMOS device 802 are controlled so as to be both enabled at the same time or both disabled at the same time under control of the selection signal $V_{SEL}$.

The control means 602 of the fourth embodiment 800 is configured for maintaining the control-voltages at the first gate 114 and the second gate 804 at a fixed voltage level with respect to the signal's common-mode voltage when the first NMOS device 106 and the second NMOS device 802 are both conducting. To this end, control means 602 has a series connection of the third resistor 610 and a fourth resistor 814 between the first input node 102 and the second input node 808. The input of the unity-gain amplifier 606 is connected to a further node 816 between the third resistor 610 and the fourth resistor 814. Instead of a resistive voltage divider between the first input node 102 and the second input node 808, here: the series connection of the third resistor 610 and the fourth resistor 814, another type of common-mode sensor could be used. The common-mode sensor preferably has a high enough input impedance for the signaling frequency range used.

A reason for not having a capacitor 612 in the differential signaling scenario is that the voltage at the further node 816 between the third resistor 610 and the fourth resistor 814 stays implicitly around the common-mode level of the differential signal. As a result, there is little need for filtering.

The configuration of the control means 602 in the fourth embodiment 800 provides a substantially constant gate-source/drain drive for the NMOS device 106 and the second NMOS device 802 at any common-mode level.

The common-mode voltage of the differential signal is measured without significantly interfering with the differential signal, for example, by means of a high-impedance resistor divider formed by the third resistor 610 and the fourth resistor 814. The residual currents that are due to the differential signals and that flow through the gate series-resistances, formed by the resistor 306 and the second resistor 812, cancel out and do therefore not affect the voltage at the input of the unity-gain amplifier 606. Accordingly, if the changes in the common-mode signal can be assumed to be slower, the control means 602 does not have to be fast and the control node 308 does not have to be low-impedance.

FIG. 9 is a diagram of a variation on the theme of the fourth embodiment 800 of FIG. 8. The control-voltage $V_{CNTL}$ is now derived from the differential output signal between the first output node 104 and the second output node 810, instead of from the differential signal between the first input node 102 and the second input node 808. The first output node 104 and the second output node 810 are connected to each other via a series arrangement of a fifth resistor 902 and a sixth resistor 904. Another further node 906 between the fifth resistor 902 and the sixth resistor 904 is connected to the input of the unity-gain amplifier 606. Instead of a resistive voltage divider between the first output node 102 and the second output node 810, here: the series connection of the fifth resistor 902 and the sixth resistor 904, another type of common-mode sensor could be used. The common-mode sensor preferably has a high enough input impedance for the signaling frequency range used.

FIG. 10 is a diagram of a fifth embodiment 1000 of a pass-gate configuration of the invention, and illustrates an implementation of the voltage source 608 in the fourth embodiment 800 of FIG. 8. As the control node 308 does not have to be low impedance, the voltage level shift can be implemented by means of, for example, a level-shift resistor 1002 of predetermined resistance and a current source 1004 supplying a current of predetermined magnitude. The current source 1004 is connected to the control node 308, and the level-shift resistor 1002 is connected between the amplifier output of the unity-gain amplifier 606 and the control node 308. The level-shift resistor 1002 can be of high impedance value for low power-consumption. Optionally, a capacitor 1006 is connected in parallel to the level-shift resistor 1002 for improving the higher frequency common-mode tracking of the control-voltage $V_{CNTL}$.

FIGS. 1-10 are diagrams relating to configurations of a pass-gate according to the invention. The diagrams discussed below relate to configurations of multiplexers (and de-multiplexers) based on pass-gates according to the invention. In order to appreciate the invention within the context of multiplexers, the basic configuration and basic functionality of a multiplexer are first discussed below and with reference to FIGS. 11, 12 and 13.

Figure 11:
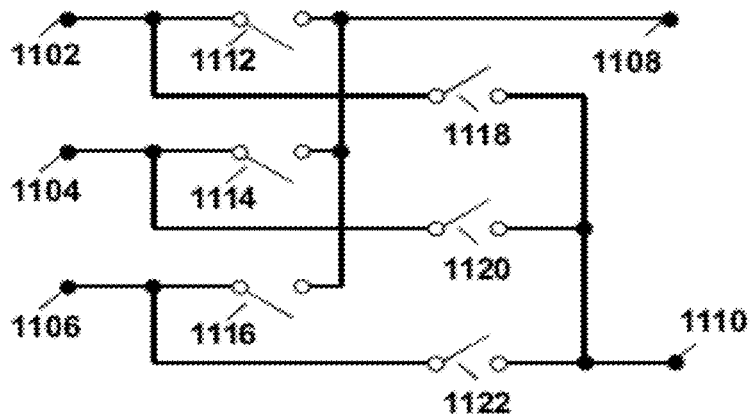
FIGS. 11, 12 and 13 are diagrams of an example of a multiplexer.
Figure 12:
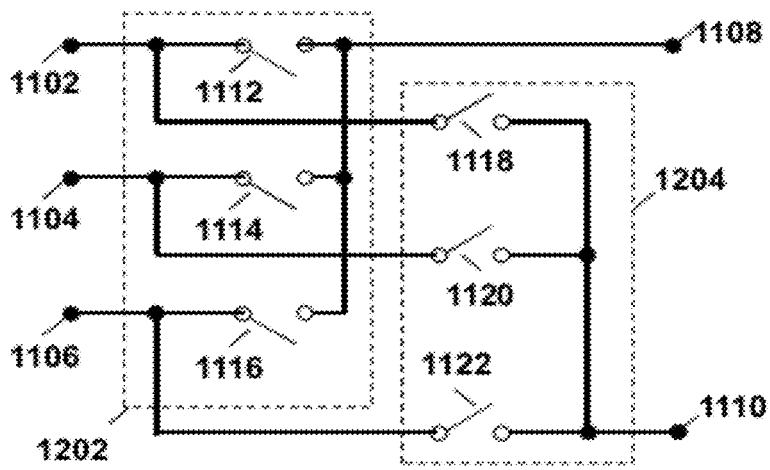
Figure 13:
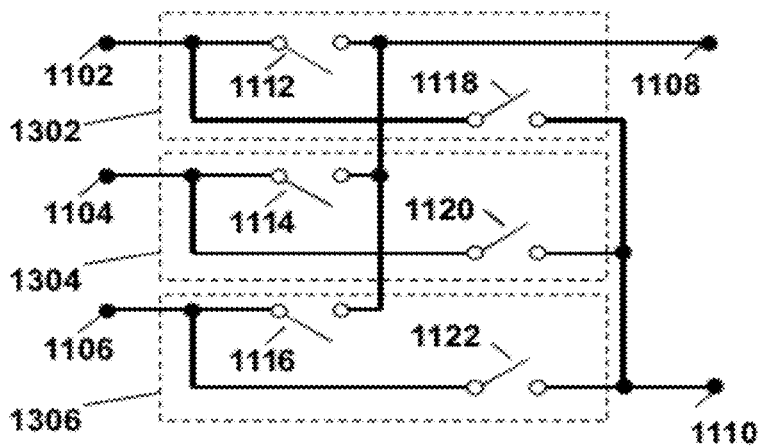

FIGS. 11, 12 and 13 are diagrams of an example of a multiplexer, here a 3×2 multiplexer 1100. The 3×2 multiplexer 1100 has a first input 1102, a second input 1104 and a third input 1106. The 3×2 multiplexer 1100 has a first output 1108 and a second output 1110. The 3×2 multiplexer 1100 further comprises a first switch 1112, a second switch 1114, a third switch 1116, a fourth switch 1118, a fifth switch 1120 and a sixth switch 1122. The 3×2 multiplexer 1100 is operative to selectively connect one of the first input 1102, the second input 1104 and the third input 1106 to the first output 1108, and to selectively connect another one of the first input 1102, the second input 1104 and the third input 1106 to the second output 1110. As known, the selective connections between, on the one hand, the first input 1102, the second input 1104 and the third input 1106 and, on the other hand, the first output 1108 and the second output 1110, are brought about by control of the states of the first switch 1112, the second switch 1114, the third switch 1116, the fourth switch 1118, the fifth switch 1120 and the sixth switch 1122.

FIG. 12 illustrates the fact that the 3×2 multiplexer 1100 can be considered a combination of a first 3×1 multiplexer 1202 and a second 3×1 multiplexer 1204. Generally, an N×M multiplexer can be considered a combination of a number of M multiplexers of the (N×1)-type.

FIG. 13 illustrates the fact that the 3×2 multiplexer 1100 can also be considered a combination of a first 1×2 demultiplexer 1302, a second 1×2 demultiplexer 1304 and a third 1×2 demultiplexer 1306.

Generally, an N×M multiplexer can therefore be considered a combination of a number of M multiplexers of the (N×1)-type, as well as a combination of a number of N demultiplexers of the (1×M)-type.

Figure 14:
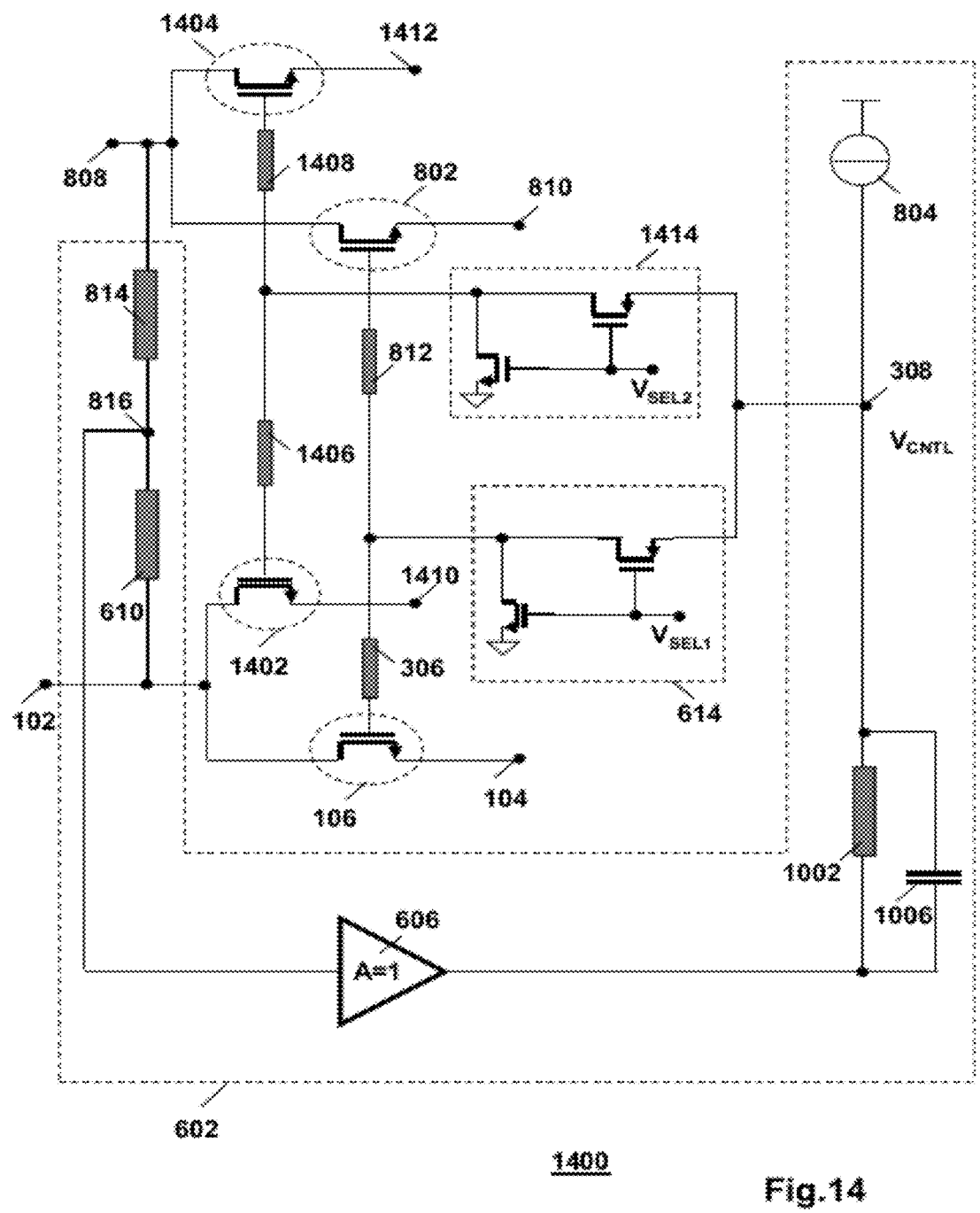
FIG. 14 is a diagram of a sixth embodiment of a pass-gate configuration in the invention forming a multiplexer.

FIG. 14 is a diagram of a sixth embodiment 1400 of a pass-gate configuration in the invention for implementing a 1×2 demultiplexer for demultiplexing a differential signal. The sixth embodiment 1400 is based on the pass-gate configuration of FIG. 8. The sixth embodiment 1400 will be referred to below as the 1×2 demultiplexer 1400. The additional components on top of those of the fifth embodiment 800 of FIG. 8 include the following: a third NMOS device 1402, a fourth NMOS device 1404, a seventh resistor 1406, an eighth resistor 1408, a third output node 1410, a fourth output node 1412, and a second selection circuit 1414.

The third NMOS device 1402 has its current channel connected between the first input node 102 and the third output node 1410. The fourth NMOS device 1404 has its current channel connected between the second input node 808 and the fourth output node 1412. The seventh resistor 1406 and the eighth resistor 1408 are connected in series between the gate of the third NMOS device 1402 and the gate of the fourth NMOS device 1404.

The second selection circuit 1414 is connected between the control node 308 and a node between the seventh resistor 1406 and the eighth resistor 1408.

The 1×2 demultiplexer 1400 is controlled so as to selectively forward a differential input signal at the first input node 102 and the second input node 808 to the first output node 104 and the second output node 810, or to the third output node 1410 and the fourth output node 1412. Control of the 1×2 demultiplexer 1400 is established via the first selection circuit 614 and the second selection circuit 1414. The first selection circuit 614 enables or disables both the first NMOS device 106 and the second NMOS device 802 under control of a first selection signal $V_{SEL1}$. The second selection circuit 1414 enables or disables both the third NMOS device 1402 and the fourth NMOS device 1404 under control of a second selection signal $V_{SEL2}$. Typically, the first selection signal $V_{SEL1}$ and the second selection signal $V_{SEL2}$ are such that the first NMOS device 106 and the second NMOS device 802 are disabled when the third NMOS device 1402 and the fourth NMOS device 1404 are enabled, and vice versa.

The first selection circuit 614 selectively connects the node between the resistor 306 and the second resistor 812 to either the control-voltage $V_{CNTL}$ or to ground under control of the first selection signal $V_{SEL1}$. The second selection circuit 1414 selectively connects the node between the seventh resistor 1406 and the eighth resistor 1408 to either the control-voltage $V_{CNTL}$ or to ground under control of the second selection signal $V_{SEL2}$. Configuration and operation of the first selection circuit 614 has been discussed above with reference to FIGS. 5 and 6. The configuration and operation of the second selection circuit 1414 are similar to those of the first selection circuit 614.

Figure 15:
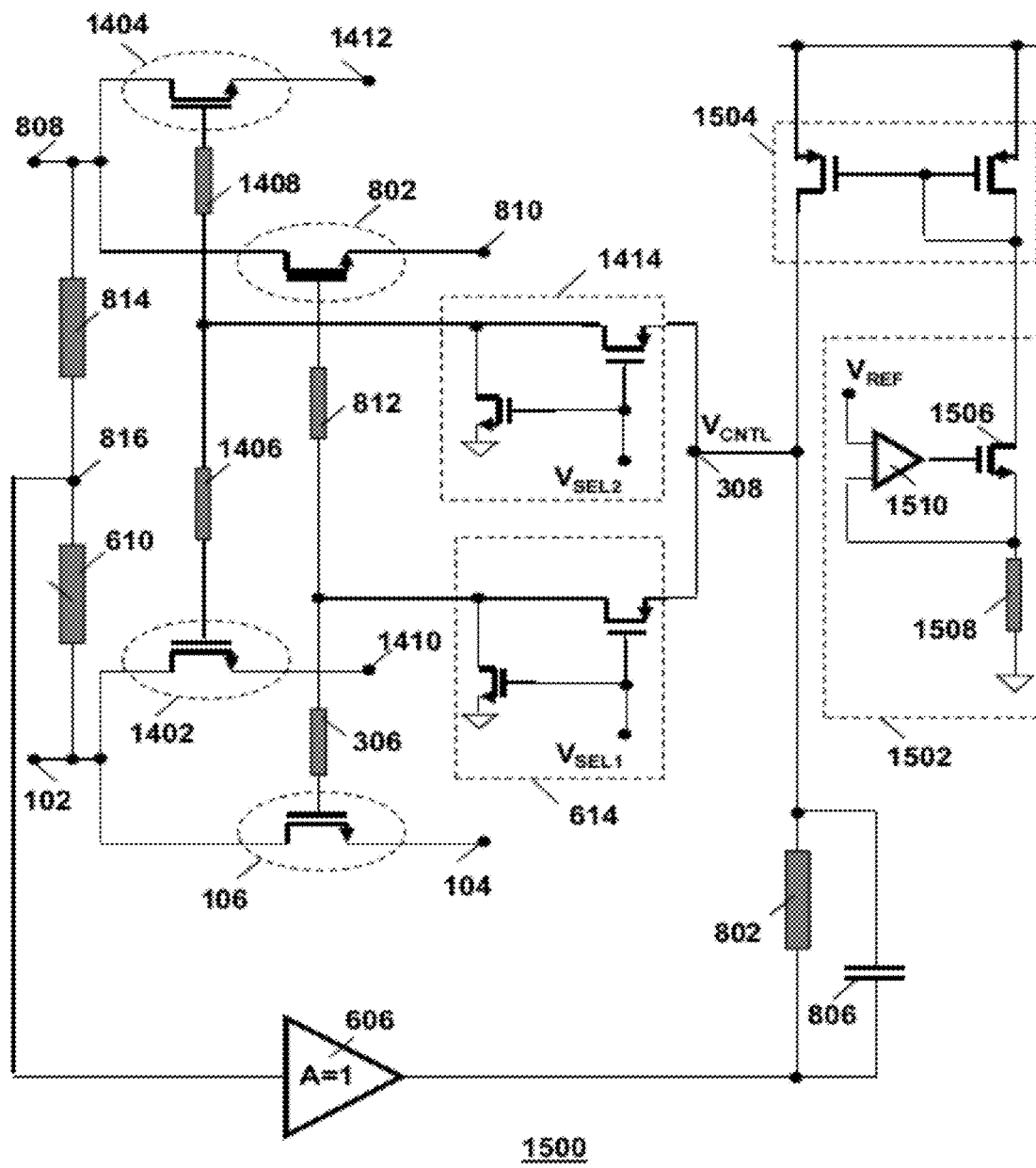
FIG. 15 is a diagram of a more detailed implementation of the multiplexer of FIG. 14.

FIG. 15 is a diagram of a more detailed implementation 1500 of the 1×2 demultiplexer 1400 of FIG. 14. The current source 804 in the 1×2 demultiplexer 1400 is implemented here using a reference current source 1502 connected to an input of a current mirror 1504. The output of the current mirror 1504 is connected to the control node 308. The current mirror 1504 is implemented with PMOS devices. The reference current source 1502 comprises a fifth NMOS device 1506, a reference resistor 1508 and a differential amplifier 1510. The fifth NMOS device 1506 has a current channel connected between the input of the current mirror 1504 and the reference resistor 1508. The reference resistor 1508 is connected between the current channel of the fifth NMOS device 1506 and ground. A first input of the differential amplifier 1510 receives a reference voltage $V_{REF}$. A second input of the differential amplifier 1510 is connected between the current channel of the fifth NMOS device 1506 and the reference resistor 1508. An output of the differential amplifier 1510 is connected to the gate of the fifth NMOS device 1506.

Figure 16:
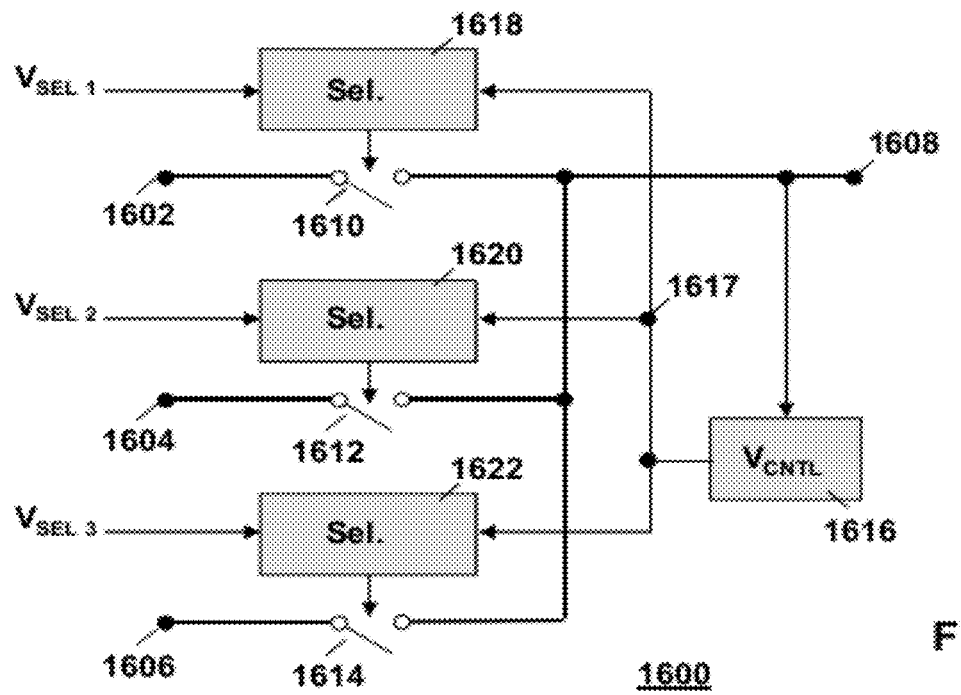
FIG. 16 is a diagram illustrating a control topology of a 3×1 multiplexer.

FIG. 16 is a block diagram illustrating a control topology of a 3×1 multiplexer 1600, such as the 3×1 multiplexer 1202 discussed above with reference to the diagram of FIG. 12. For simplicity, the topology is represented for single-ended signal paths.

The 3×1 multiplexer 1600 has a first input node 1602, a second input node 1604, a third input node 1606 and an output node 1608. The 3×1 multiplexer 1600 has a first pass-gate 1610, a second pass-gate 1612 and a third pass-gate 1614. The first pass-gate 1610 is connected between the first input node 1602 and the output node 1608. The second pass-gate 1612 is connected between the second input node 1604 and the output node 1608. The third pass-gate 1614 is connected between the third input node 1602 and the output node 1608. The first pass-gate 1610, the second pass-gate 1612 and the third pass-gate 1614 are of the type discussed with reference to the diagrams of the previous FIGS. 1-10, e.g., of the type of the pass-gate implemented with NMOS device 106.

The 3×1 multiplexer 1600 comprises control means 1616 for generating a control-voltage $V_{CNTL}$. The control means 1616 is similar to the control means 602 discussed above, e.g., with reference to the diagram of FIG. 7. The control means 1616 has an input connected to the output node 1608 and has an output connected to a control node 1617.

The 3×1 multiplexer 1600 comprises a first selection circuit 1618, a second selection circuit 1620 and a third selection circuit 1622. Each of the first selection circuit 1618, the second selection circuit 1620 and the third selection circuit 1622 is similar to the selection circuit 614 discussed above, e.g., with reference to FIGS. 6 and 7. Alternatively, the first selection circuit 1618, the second selection circuit 1620 and the third selection circuit 1622 can be implemented as shown in the diagram of FIG. 5. The first selection circuit 1618 is connected to the control node 1617 for receipt of the control-voltage $V_{CNTL}$, and receives a first selection signal $V_{SEL1}$ for selective control of the first pass-gate 1610. The second selection circuit 1620 is connected to the control node 1617 for receipt of the control-voltage $V_{CNTL}$, and receives a second selection signal $V_{SEL2}$ for selective control of the second pass-gate 1612. The third selection circuit 1622 is connected to the control node 1617 for receipt of the control-voltage $V_{CNTL}$, and receives a third selection signal $V_{SEL3}$ for selective control of the third pass-gate 1614.

Note that for a 3×1 multiplexer configured for multiplexing differential signals, a similar control topology can be adopted as above, based on, for example, the pass-gate configuration of the diagram in FIG. 9. That is, the control-voltage $V_{CNTL}$ is derived from a series arrangement of resistors connected between the differential output of the 3×1 multiplexer, and is provided to respective selection circuits that control the states of respective pairs of NMOS devices.

Figure 17:
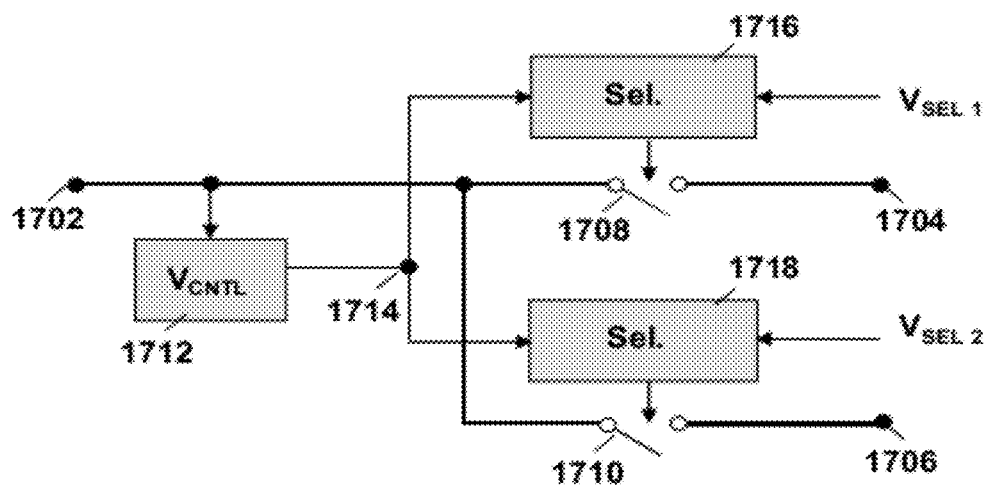
FIG. 17 is a diagram illustrating a control topology of a 1×2 multiplexer.

FIG. 17 is a diagram illustrating a control topology of a 1×2 demultiplexer 1700, such as the 1×2 demultiplexer 1302 discussed above with reference to the diagram of FIG. 13. For simplicity, the topology is represented for single-ended signal paths.

The 1×2 demultiplexer 1700 has an input node 1702, a first output node 1704 and a second output node 1706. The 1×2 demultiplexer 1700 has a first pass-gate 1708 and a second pass-gate 1710. The first pass-gate 1708 is connected between the input node 1702 and the first output node 1704. The second pass-gate 1710 is connected between the input node 1702 and the second output node 1706. The first pass-gate 1708 and the second pass-gate 1710 are of the type discussed with reference to the diagrams of the previous FIGS. 1-10, e.g., of the type of the pass-gate implemented with NMOS device 106.

The 1×2 demultiplexer 1700 comprises control means 1712 for generating a control-voltage $V_{CNTL}$. The control means 1712 is similar to the control means 602 discussed above, e.g., with reference to the diagrams of FIGS. 6 and 7. The control means 1712 has an input connected to the input node 1702 and has an output connected to a control node 1714.

The 1×2 demultiplexer 1700 comprises a first selection circuit 1716 and a second selection circuit 1718. Each of the first selection circuit 1716 and the second selection circuit 1718 is similar to the selection circuit 614 discussed above, e.g., with reference to FIGS. 6 and 7. Alternatively, the first selection circuit 1716 and the second selection circuit 1718 can be implemented as shown in the diagram of FIG. 5. The first selection circuit 1716 is connected to the control node 1714 for receipt of the control-voltage $V_{CNTL}$. The first selection circuit 1716 receives a first selection signal $V_{SEL1}$ for selective control of the first pass-gate 1708. The second selection circuit 1718 is connected to the control node 1714 for receipt of the control-voltage $V_{CNTL}$. The second selection circuit 1718 receives a second selection signal $V_{SEL2}$ for selective control of the second pass-gate 1710.

Note that for a 1×2 demultiplexer configured for multiplexing differential signals, a similar control topology can be adopted as above, based on the pass-gate configuration of, for example, the diagram in FIG. 8. That is, the control-voltage $V_{CNTL}$ is derived from a series arrangement of resistors connected between the differential input of the 1×2 demultiplexer, and is provided to respective selection circuits that control the states of respective pairs of NMOS devices.

As discussed above with reference to the diagrams of FIGS. 11, 12 and 13, a typical N×M-multiplexer can be considered modular combination of a number of N modules that each comprise an M×1-multiplexer, or a modular combination of a number of M modules that each include a 1×N-demultiplexer. The diagrams of the 3×1 multiplexer 1600 and of the 1×2 demultiplexer 1700 illustrate the control configurations per individual one of the modules.

Figure 18:
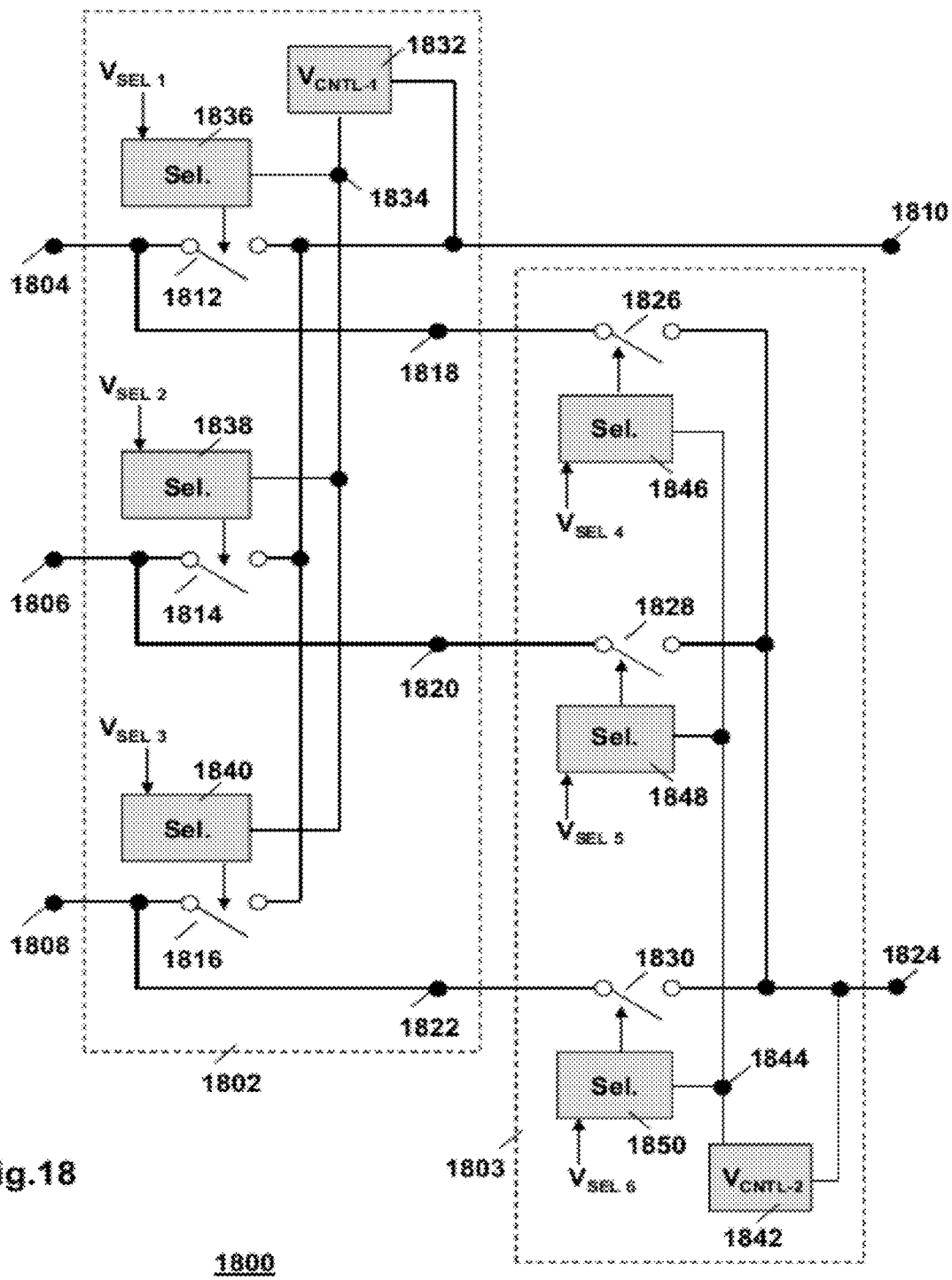
FIG. 18 is a diagram of the control topology of a 3×2 multiplexer.

FIG. 18 is a diagram of the control topology of a 3×2 multiplexer 1800, represented here as a modular configuration of a first 3×1 multiplexer 1802 and a second 3×1 multiplexer 1803.

The first 3×1 multiplexer 1802 comprises a first input node 1804, a second input node 1806, a third input node 1808 and a first output node 1810. The first 3×1 multiplexer 1802 has a first pass-gate 1812, a second pass-gate 1814 and a third pass-gate 1816. The first pass-gate 1812 is connected between the first input node 1804 and the first output node 1810. The second pass-gate 1814 is connected between the second input node 1806 and the first output node 1810. The third pass-gate 1816 is connected between the third input node 1808 and the first output node 1810. The first pass-gate 1812, the second pass-gate 1814 and the third pass-gate 1816 are, for example, of the type of the pass-gate implemented with NMOS device 106 discussed above.

The first 3×1 multiplexer 1802 has first control means 1832 with an input connected to the first output 1810 and with an output connected to a first control node 1834. The first control means 1832 is operative to supply a first control-voltage $V_{CNTL-1}$ to the first control node 1834. The first control means 1832 is similar to the control means 602 discussed above, e.g., with reference to the diagram of FIGS. 6 and 7.

The first 3×1 multiplexer 1802 further comprises a first selection circuit 1836, a second selection circuit 1838 and a third selection circuit 1840. Each of the first selection circuit 1836, the second selection circuit 1838 and the third selection circuit 1840 is similar to the selection circuit 614 discussed above, e.g., with reference to FIGS. 6 and 7. The first selection circuit 1836 is connected to the first control node 1834 for receipt of the first control-voltage $V_{CNTL-1}$, and receives a first selection signal $V_{SEL1}$ for selective control of the first pass-gate 1812. The second selection circuit 1838 is connected to the first control node 1834 for receipt of the first control-voltage $V_{CNTL-1}$, and receives a second selection signal $V_{SEL2}$ for selective control of the second pass-gate 1814. The third selection circuit 1840 is connected to the first control node 1834 for receipt of the first control-voltage $V_{CNTL-1}$, and receives a third selection signal $V_{SEL3}$ for selective control of the third pass-gate 1816.

The second 3×1 multiplexer 1804 comprises a fourth input node 1818, a fifth input node 1820, a sixth input node 1822 and a second output node 1824. The fourth input node 1818 is connected to the first input node 1804 of the first 3×1 multiplexer 1802. The fifth input node 1820 is connected to the second input node 1806 of the first 3×1 multiplexer 1802. The sixth input node 1822 is connected to the third input node 1808 of the first 3×1 multiplexer 1802. The second 3×1 multiplexer 1804 has a fourth pass-gate 1826, a fifth pass-gate 1828 and a sixth pass-gate 1830. The third pass-gate 1826 is connected between the fourth input node 1818 and the second output node 1824. The fifth pass-gate 1828 is connected between the fifth input node 1820 and the second output node 1824. The sixth pass-gate 1830 is connected between the sixth input node 1822 and the second output node 1824. The fourth pass-gate 1826, the fifth pass-gate 1828 and the sixth pass-gate 1830 are, for example, of the type of the pass-gate implemented with NMOS device 106 discussed above.

The second 3×1 multiplexer 1804 has second control means 1842 with an input connected to the second output 1824 and with an output connected to a second control node 1844. The second control means 1842 is operative to supply a second control-voltage $V_{CNTL-2}$ to the second control node 1844. The second control means 1842 is similar to the control means 602 discussed above, e.g., with reference to the diagram of FIGS. 6 and 7.

The second 3×1 multiplexer 1804 further comprises a fourth selection circuit 1846, a fifth selection circuit 1848 and a sixth selection circuit 1850. Each of the fourth selection circuit 1846, the fifth selection circuit 1848 and the sixth selection circuit 1850 is similar to the selection circuit 614 discussed above, e.g., with reference to FIGS. 6 and 7 The fourth selection circuit 1846 is connected to the second control node 1844 for receipt of the second control-voltage $V_{CNTL-2}$, and receives a fourth selection signal $V_{SEL4}$ for selective control of the fourth pass-gate 1826. The fifth selection circuit 1848 is connected to the second control node 1844 for receipt of the second control-voltage $V_{CNTL-2}$, and receives a fifth selection signal $V_{SEL5}$ for selective control of the fifth pass-gate 1828. The sixth selection circuit 1850 is connected to the second control node 1844 for receipt of the second control-voltage $V_{CNTL-2}$, and receives a sixth selection signal $V_{SEL6}$ for selective control of the sixth pass-gate 1830.

The 3×2 multiplexer 1800 is shown in FIG. 18 as organized in two modules of a 3×1 multiplexer each. Note that each individual one of the first 3×1 multiplexer 1802 and the second 3×1 multiplexer 1804 is equipped with individual control means. Consider now a 3×2 multiplexer organized in three modules with a 1×2 demultiplexer each, as illustrated in the diagram of FIG. 13 discussed above. Then, each individual one of the three modules were to be equipped with individual control means. More generally, consider an N×M multiplexer, wherein N is larger than M, and consider a modular control topology according to the invention for generating the control-voltage(s). The modular control topology can be chosen as, for example, a first combination of M modules with an N×1 multiplexer each, or a second combination of N modules with a 1×M demultiplexer each. In the first combination, each individual one of the M modules has individual control means, and the associated control topology requires then a number of M individual control means. In the second combination, each individual one of the N modules has individual control means, and the associated control topology requires then a number of N individual control means. As N is larger than M, it may therefore be more convenient to adopt a control topology based on a number of M modules with an N×1 multiplexer each, in view of the smaller number of implementing components needed and/or in view of lower power consumption of the N×M multiplexer as a whole.

The condition that N be larger than M is not a limitation here, owing to the directional symmetry of the schemes and of the pass-gates. That is, what has been explained above with regard to an N×M multiplexer, wherein N is larger than M, applies similarly to an M×N multiplexer wherein N is larger than M. For example, consider the 3×2 multiplexer 1100 discussed above with reference to the diagrams of FIGS. 12 and 13. Therein, the nodes with reference numerals 1102, 1104 and 1106 are used as the input nodes and the nodes with reference numerals 1108 and 1110 are used as the output nodes. Now consider a scenario wherein the nodes with reference numerals 1108 and 1110 are used as the input nodes, and wherein the nodes with reference numerals 1102, 1104 and 1106 are used as the output nodes. The diagrams of FIGS. 12 and 13 are then interpreted as those of a 2×3 multiplexer that can be considered a first combination of two 1×3 multiplexers according to FIG. 12, or as a second combination of three 2×1 multiplexers according to FIG. 13. Again, the first combination requires two individual control means for the generation of the individual control-voltages per individual one of the two 1×3 multiplexers, whereas the second combination requires three individual control means for the generation of the individual control-voltages per individual one of the three 2×1 multiplexers.

Also note that in the first 3×1 multiplexer 1802 the first control means 1832 has its input connected to the first output 1810, and that in the second 3×1 multiplexer 1804 the second control means 1842 has its input connected to the second output 1824.

Part of the description of the invention has assumed DC-balance for ease of description and comprehensibility. However, a DC-balance for the multiplexed signals is not strictly required. This invention can be applied if the first-order filtered input signal does not have significant amplitude compared to the effective gate drive of the switch transistor. Even if this condition is not fulfilled the invention can be applied as shown for single-ended signals, as discussed under FIG. 6. This can also be extended to differential versions with non DC-balanced differential signals.

The invention has been described using NMOS transistors in the pass-gates. The invention can also be implemented with PMOS transistors, where biasing conditions will be of opposite polarity.

This invention has been described using MOS transistors. However, the invention can also be used with any other type of switch devices whose on-resistance can be changed by means of a control terminal which has a high enough dc-resistance to all other nodes. The fact that the gate voltage needs to be increased with respect to the signal (average/common-mode) voltage to turn on NMOS transistors, does not limit this invention and this may be different for other types of switch devices as a consequence of the switch device characteristics.

The invention claimed is:

1. An electronic circuit, comprising:
a first pass-gate with a first voltage-controlled switch, wherein:
the first pass-gate has a first input node, a first output node and a control node;
the first voltage-controlled switch has a first passageway, arranged between the first input node and the first output node, and a first control electrode coupled to the control node, and a first capacitance between the first input node and the first control electrode; and
the first pass-gate is operative to selectively open and close the first passageway to a first signal at the first input node under control of a control-voltage at the control node; and wherein
the first pass-gate has a controller, including a first resistor between the first control electrode and the control node, that is configured to control a first voltage at the first control electrode to follow a second voltage at a particular one of the first input node and the first output node when the first passageway is open; and
a selection circuit for selectively coupling the control node to the resistor under control of a selection signal.

2. The electronic circuit of claim 1, wherein:
the controller further comprises a voltage level-shifter with a level-shifter input and a level-shifter output;
the level-shifter input is coupled to the particular one of the first input node and the first output node for receipt of the second voltage;
the level-shifter output is coupled to the control node for supply of the control-voltage; and
the voltage level-shifter is configured for generating the control-voltage by level-shifting a further voltage representative of the second voltage.

3. An electronic circuit comprising:
a first pass-gate with a first voltage-controlled switch and a second pass-gate with a second voltage-controlled switch, wherein
the first pass-gate has a first input node and a first output node;
the first voltage-controlled switch has a first passageway arranged between the first input node and the first output node, and a first control electrode;
the second pass-gate has a second input node and a second output node;
the second voltage-controlled switch has a second passageway, arranged between the second input node and the second output node, and a second control electrode;
the first control electrode and the second control electrode are coupled to a control node;
the first pass-gate is operative to selectively open and close the first passageway to a first signal at the first input node under control of a control-voltage at the control node;
the second pass-gate is operative to selectively open and close the second passageway to a second signal at the second input node under control of the control-voltage at the control node;
a controller, that includes a voltage level-shifter, configured to control a first voltage at the first control electrode to substantially follow a second voltage at a particular one of the first input node and the first output node when the first passageway is open and to control a third voltage at the second control electrode to substantially follow a fourth voltage at a specific one of the second input node and the second output node when the second passageway is open; and
wherein
the first voltage-controlled switch has a first capacitance between the first input node and the first control electrode, and a second capacitance between the first output node and the first control electrode;
the second voltage-controlled switch has a third capacitance between the second input node and the second control electrode, and a fourth capacitance between the second output node and the second control electrode; and the controller comprises:
a first resistor connected between the first control electrode and another node;
a second resistor connected between the second control electrode and the other node; and
the other node is coupled to the control node.

4. The electronic circuit of claim 3, wherein:
the voltage level-shifter includes a level-shifter input and a level-shifter output;
the controller further comprises a third resistor and a fourth resistor connected in series via a further node between the first input node and the second input node, or between the first output node and the second output node;
the level-shifter input is coupled to the further node;
the level-shifter output is coupled to the control node for supply of the control-voltage; and
the voltage level-shifter is configured for generating the control-voltage by level-shifting a further voltage present at the further node.

5. The electronic circuit of claim 3, further comprising a selection circuit for selectively coupling the control node to the other node under control of a selection signal.

6. An electronic circuit comprising:
an M×1 multiplexer for multiplexing a number of M single-ended input signals to a single single-ended output signal, wherein:
the M×1 multiplexer comprises a first number of M multiplexer inputs, a single multiplexer output, and a first number of M first pass-gates;
a respective one of the first pass-gates comprises a respective first input node and a respective first output node;
the respective first pass-gate has the respective first input node connected to a respective one of the multiplexer inputs;
the respective first pass-gate has the respective first output node connected to the single multiplexer output;
the respective first pass-gate has a respective first voltage-controlled switch;
the respective first voltage-controlled switch has a respective first passageway, arranged between the respective first input node and the respective first output node, and a respective first control electrode;
the respective first voltage-controlled switch has a respective first capacitance between the respective first input node and the respective first control electrode, and a respective second capacitance between the respective first output node and the respective first control electrode;
the respective first pass-gate has a respective selection circuit configured for control of a respective first voltage at the respective first control electrode in dependence on a respective selection signal in order to selectively open and close the respective first passageway; and
wherein
the M×1 multiplexer has a controller configured to control the respective first voltage at the respective first control electrode to substantially follow a respective second voltage at the respective first output node when the respective first passageway is open;
the controller comprises:
a control node;
a number of M first resistors; and
a voltage level-shifter with a level-shifter input and a level-shifter output;
a respective one of the first resistors is coupled between the respective first control electrode and the control node;
the level-shifter input is coupled to the multiplexer output for receipt of the respective second voltage;
the voltage level-shifter is configured for supplying at the level-shifter output a control-voltage by level-shifting a respective further voltage representative of the respective second voltage;
the level-shifter output is coupled to the control node for supply of the control-voltage; and
the respective selection circuit is operative to couple the control node to the respective resistor under control of the respective selection signal.

7. The electronic circuit of claim 1, wherein the electronic circuit includes a plurality of pass-gates, including the first pass-gate, and the selection circuit interconnected to form a multiplexer.

8. The electronic circuit of claim 7, wherein the multiplexer is configured and arranged to selectively pass a number of single-ended input signals at respective input terminals into a single output signal at an output terminal.

9. The electronic circuit of claim 7, wherein the multiplexer is configured and arranged to selectively pass a number of single-ended input signals at respective input terminals for an output signal.

* * * * *